(12) United States Patent
Tang et al.

(10) Patent No.: US 12,381,139 B2
(45) Date of Patent: Aug. 5, 2025

(54) ELECTRONIC DEVICE AND MULTILEVEL PACKAGE SUBSTRATE WITH ELEVATED TRACE FEATURES FOR SOLDER AND/OR DIE CONFINEMENT AND METHOD FOR FABRICATING THE ELECTRONIC DEVICE

(71) Applicant: TEXAS INSTRUMENTS INCORPORATED, Dallas, TX (US)

(72) Inventors: Yiqi Tang, Allen, TX (US); Guangxu Li, Allen, TX (US); Rajen Manicon Murugan, Dallas, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 640 days.

(21) Appl. No.: 17/677,042

(22) Filed: Feb. 22, 2022

(65) Prior Publication Data

US 2023/0268259 A1 Aug. 24, 2023

(51) Int. Cl.
*H01L 23/498* (2006.01)
*H01L 21/48* (2006.01)
*H01L 21/56* (2006.01)
*H01L 23/00* (2006.01)
*H01L 23/31* (2006.01)

(52) U.S. Cl.
CPC .... *H01L 23/49822* (2013.01); *H01L 21/4857* (2013.01); *H01L 21/56* (2013.01); *H01L 23/3107* (2013.01); *H01L 24/16* (2013.01); *H01L 24/32* (2013.01); *H01L 24/81* (2013.01); *H01L 24/83* (2013.01); *H01L 2224/16227* (2013.01); *H01L 2224/32227* (2013.01); *H01L 2224/81007* (2013.01); *H01L 2224/8385* (2013.01)

(58) Field of Classification Search
CPC ........... H01L 23/29822; H01L 21/4857; H01L 24/16; H01L 24/32; H01L 2224/16227; H01L 2224/32227; H01L 21/56; H01L 23/3107; H01L 23/49822; H01L 24/81; H01L 24/83; H01L 21/6835; H01L 2224/81007; H01L 2224/8385
See application file for complete search history.

(56) References Cited

U.S. PATENT DOCUMENTS

| 8,125,054 B2 * | 2/2012 | West ..................... H01L 23/585 |
| | | 438/106 |
| 9,373,878 B2 * | 6/2016 | Schuppener ............ H01P 3/165 |
| 9,570,788 B2 * | 2/2017 | Payne ..................... H01P 5/107 |

(Continued)

*Primary Examiner* — Khiem D Nguyen
(74) *Attorney, Agent, or Firm* — Ronald O. Neerings; Frank D. Cimino

(57) ABSTRACT

An electronic device with a multilevel package substrate having multiple levels including a first level having conductive leads and a final level having conductive landing areas along a side, as well as a die mounted to the multilevel package substrate and having conductive terminals electrically coupled to respective ones of the conductive leads, and a package structure that encloses the die and a portion of the multilevel package substrate, where the multilevel package substrate has a conductive elevated trace layer with a confinement feature that extends outward from the side of the final level along a third direction that is orthogonal to the first and second directions, the confinement feature having a sidewall configured to laterally confine one of a solder, an adhesive, a side of a passive component, and a side of the die.

20 Claims, 21 Drawing Sheets

(56) References Cited

U.S. PATENT DOCUMENTS

| | | | |
|---|---|---|---|
| 11,094,449 B2* | 8/2021 | Massolini | B22F 7/06 |
| 2009/0302463 A1* | 12/2009 | Gallegos | H05K 3/3473 |
| | | | 257/737 |
| 2016/0163935 A1* | 6/2016 | Yap | H01L 33/54 |
| | | | 257/98 |
| 2020/0251436 A1 | 8/2020 | Williamson et al. | |
| 2021/0327790 A1* | 10/2021 | Murugan | H01L 24/16 |

* cited by examiner

ELECTRONIC DEVICE AND MULTILEVEL PACKAGE SUBSTRATE WITH ELEVATED TRACE FEATURES FOR SOLDER AND/OR DIE CONFINEMENT AND METHOD FOR FABRICATING THE ELECTRONIC DEVICE

BACKGROUND

Bond line thickness (BLT) is a measure of the bond formed by soldering semiconductor dies to lead frames, for example, using flip-chip soldering. Reliability of the connection is important for automotive, industrial or other applications and system performance can be impacted if the bond line thickness is too small. Bond line thickness problems such as solder joint cracking or mold material delamination can adversely affect chip level reliability (CLR) for devices having a die flip-chip soldered to a substrate. Using taller copper bump or conductive terminals on the bottom of the die can mitigate reduced bond line thickness as associated reliability problems, as can using more solder paste and/or refined mold flowing processing, but these approaches add cost and can cause other problems.

SUMMARY

In one aspect, an electronic device includes a multilevel package substrate having multiple levels including a first level having conductive leads and a final level having conductive landing areas along a side, as well as a die mounted to the multilevel package substrate and having conductive terminals electrically coupled to respective ones of the conductive leads, and a package structure that encloses the die and a portion of the multilevel package substrate, where the multilevel package substrate has a conductive elevated trace layer with a confinement feature that extends outward from the side of the final level along a third direction that is orthogonal to the first and second directions, the confinement feature having a sidewall configured to laterally confine one of a solder, an adhesive, a side of a passive component, and a side of the die.

In another aspect, a multilevel package substrate includes a first level that extends in a first plane of orthogonal first and second directions and has conductive leads, and a final level having conductive landing areas along a side that extends in another plane of the first and second directions. The multilevel package substrate includes a conductive elevated trace layer with a confinement feature that extends outward from the side of the final level along a third direction that is orthogonal to the first and second directions. The confinement feature has a sidewall configured to laterally confine one of a solder, an adhesive, a side of a passive component, and a side of a die.

In a further aspect, a method of fabricating an electronic device includes fabricating a multilevel package substrate, including a first level extending in a first plane of a first direction and an orthogonal second direction and having conductive leads, and a final level having conductive landing areas along a side that extends in another plane of the first and second directions. The method includes forming a conductive elevated trace layer with a confinement feature that extends outward from the side of the final level along a third direction that is orthogonal to the first and second directions, where the confinement feature has a sidewall configured to laterally confine one of a solder, an adhesive, a side of a passive component, and a side of a die. The method further includes attaching a die to the multilevel package substrate, electrically coupling conductive terminals of the die to respective ones of the conductive leads and performing a molding process that forms a package structure that encloses the die and a portion of the multilevel package substrate, and the package structure exposes portions of the first level.

DETAILED DESCRIPTION

Figure 1:
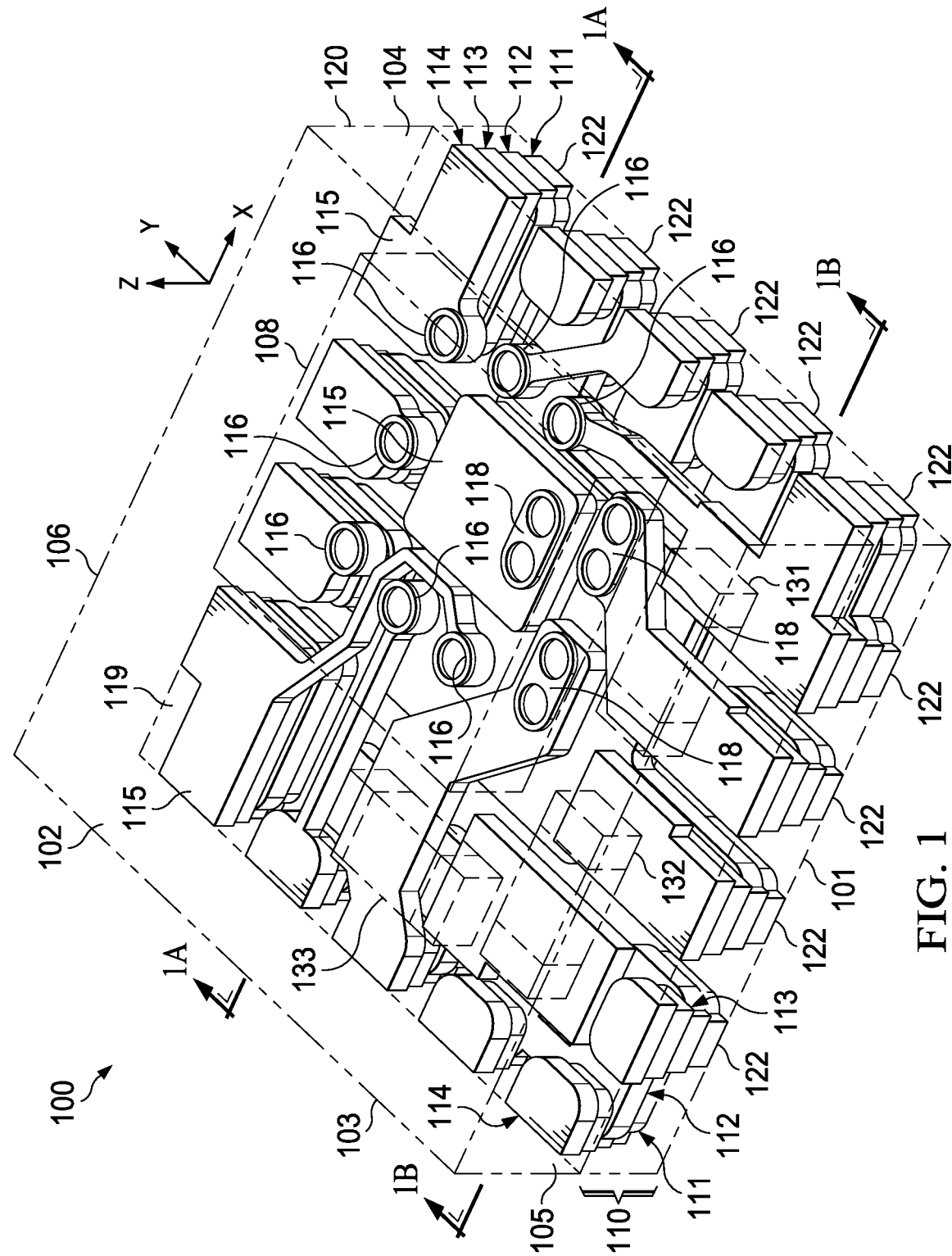
FIG. 1 is a top perspective view of a packaged electronic device having a multilevel package substrate with a conductive elevated trace layer that includes confinement features with sidewalls that surround conductive terminals of a semiconductor die for solder confinement to improve bond line thickness and chip level reliability according to one embodiment.

In the drawings, like reference numerals refer to like elements throughout, and the various features are not necessarily drawn to scale. Also, the term "couple" or "couples" includes indirect or direct electrical or mechanical connection or combinations thereof. For example, if a first device couples to or is coupled with a second device, that connection may be through a direct electrical connection, or through an indirect electrical connection via one or more intervening devices and connections. Described examples provide multilevel package substrates with elevated traces having confinement features for confining solder, adhesive materials and/or structural features of semiconductor dies and/or passive components during manufacturing to mitigate thin bond line thickness and enhance chip level reliability.

Figure 1A:
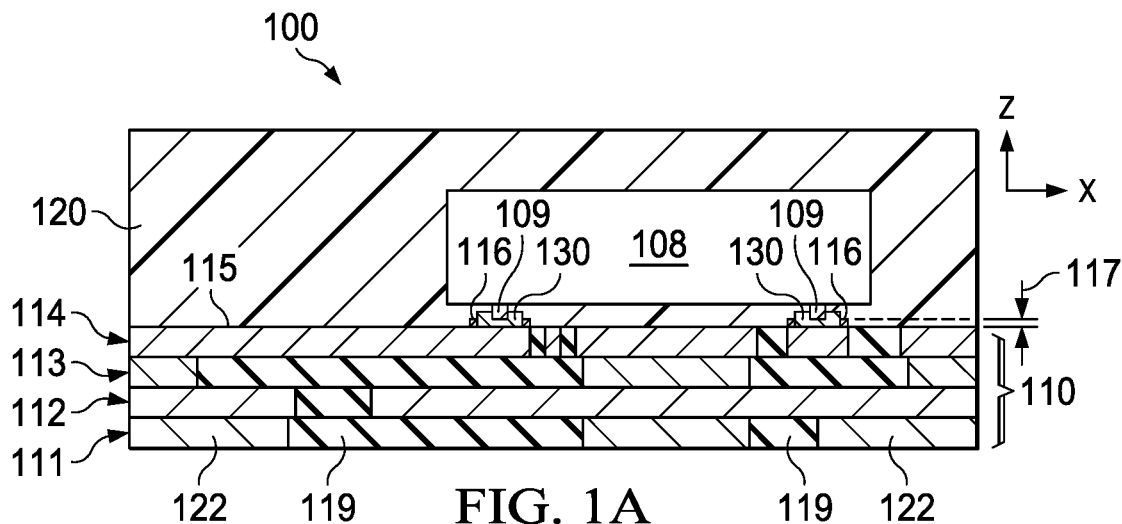
FIG. 1A is a partial sectional side elevation view of the electronic device taken along line 1A-1A of FIG. 1.
Figure 1B:
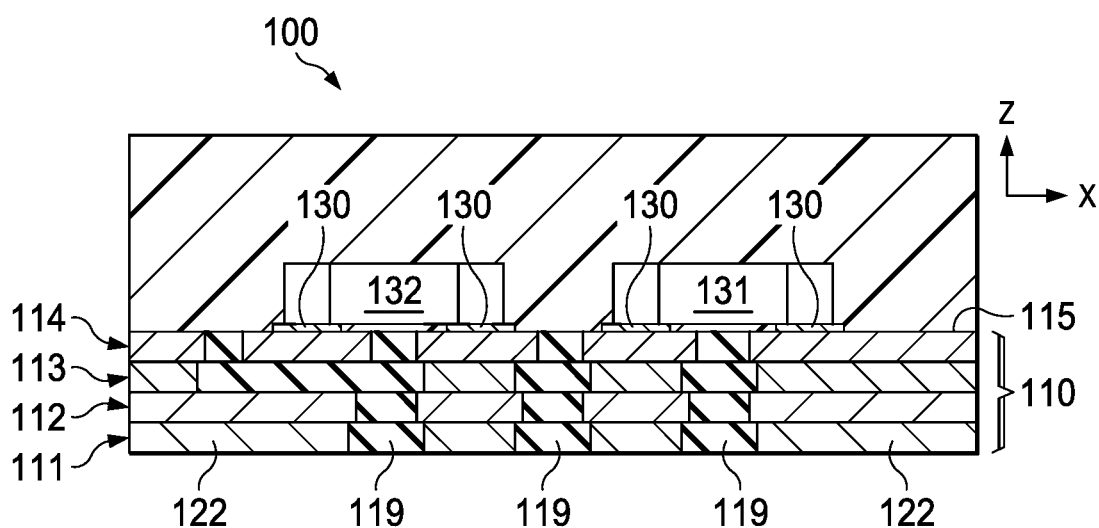
FIG. 1B is a partial sectional side elevation view of the electronic device taken along line 1B-1B of FIG. 1.
Figure 1C:
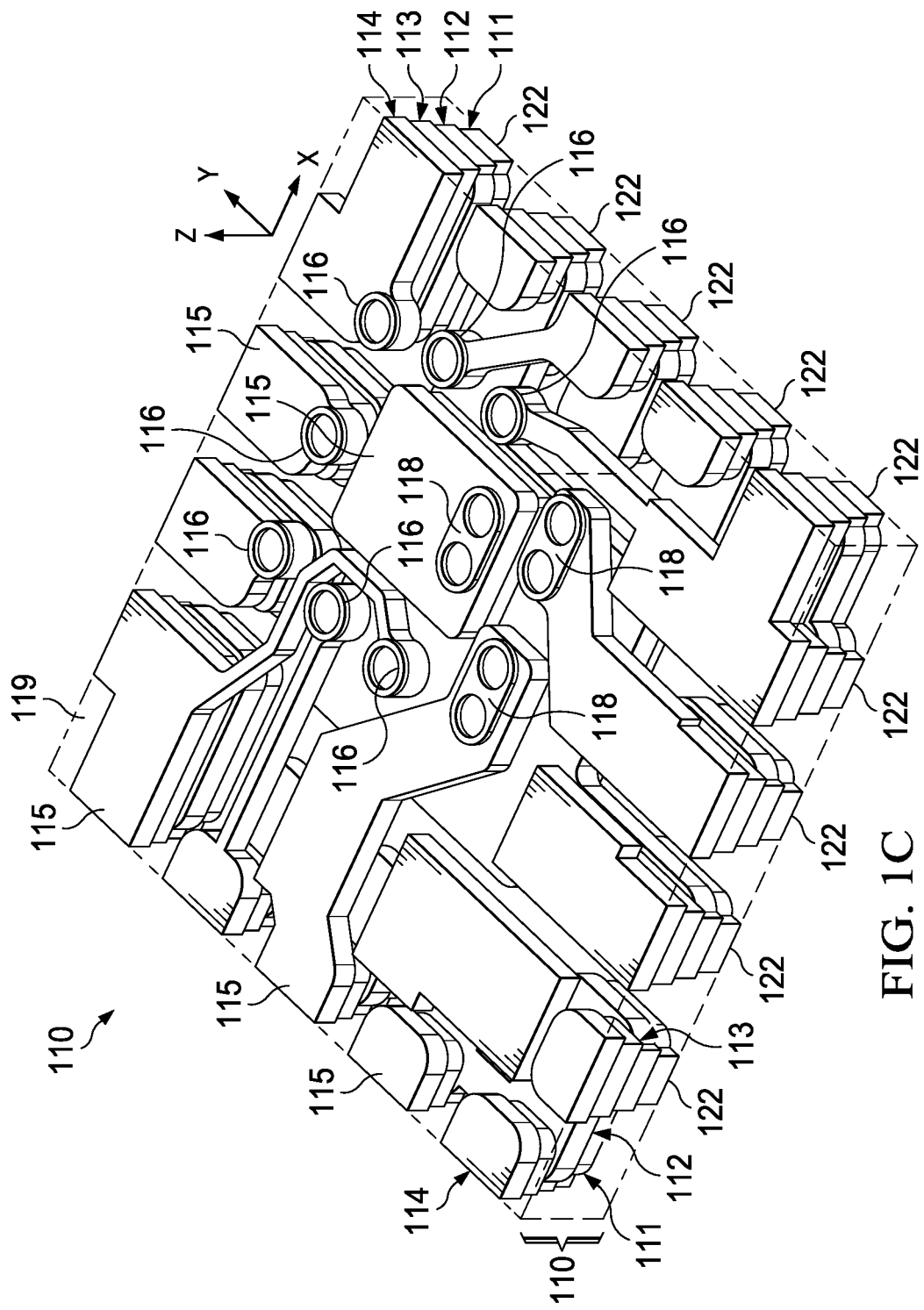
FIG. 1C is a top perspective view of the multilevel package substrate of the electronic device of FIG. 1.

FIGS. 1-1C illustrate a first example packaged electronic device 100. The electronic device 100 has a rectangular shape with a first or bottom side 101, a second or top side 102, opposite third and fourth (e.g., left and right) sides 103 and 104, as well as fifth and sixth (e.g., front and back) sides 105 and 106. The electronic device 100 also includes a semiconductor die 108 having conductive terminals 109 shown in FIG. 1A (e.g., copper pillars or bumps). The semiconductor die 108 is flip-chip soldered to a multilevel package substrate 110. The conductive terminals 109 of the die 108 in this example are soldered to respective conductive landing areas (e.g., patterned conductive surfaces) of a final level of the multilevel package substrate 110.

The multilevel package substrate 110 has multiple levels. In the illustrated example, the multilevel package substrate 110 has four levels, including a first level 111, a second level 112, a third level 113, and a final (e.g., fourth) level 114. In other implementations, the multilevel package substrate 110 has any integer number N levels, where N is greater than 1. The individual levels 111-114 extend in respective planes of orthogonal first and second directions (e.g., the X and Y directions) in the illustrated orientation and form a stacked arrangement along a third (e.g., Z) direction that is orthogonal to the first and second directions X and Y. The final level 114 has an upper side 115 that forms a top side of the multilevel package substrate 110 and includes a die attach pad beneath the die 108. The multilevel package substrate 110 has a conductive elevated trace layer with confinement features 116 and 118 that extend outward (e.g., upward) from the side 115 of the final level 114 by a height 117 (e.g., 30 μm+/−3 μm) along a third direction Z that is orthogonal to the first and second directions X and Y. The multilevel package substrate 110 includes dielectric electrically insulating material 119 within and between patterned conductive features of the levels 111-114.

The electronic device 100 includes a package structure 120, such as a plastic molded material that encloses the die 108 and a portion of the multilevel package substrate 110, and the package structure 120 exposes portions of the first level 111. The first level 111 extends in a first X-Y plane at the bottom of the stacked arrangement, and an includes patterned conductive features (e.g., copper or other conductive metal) having bottom sides exposed along a bottom of the multilevel package substrate 110, where certain of the patterned conductive features of the first level 111 are conductive leads 122. The final level 114 has conductive landing areas along the side 115. The side 115 of the final level 114 extends in another X-Y plane.

As best shown in FIG. 1A, the die 108 is flip-chip mounted to the multilevel package substrate 110. One or more of the conductive terminals 109 of the die 108 are electrically coupled to respective ones of the conductive leads 122 through the conductive traces and routing features of the multilevel package substrate 110. The conductive terminals 109 of the die 108 are soldered to respective conductive landing areas on corresponding portions of the side 115 of the final level 114 of the multilevel package substrate 110 via solder 130. The solder 130 may extend between bottom surface of some or all of the conductive terminals 109 of the die 108 and the upper surfaces of the conductive landing areas on corresponding portions of the side 115 and/or the bottom surface of one or more of the conductive terminals 109 of the die 108 can be in direct contact with the upper surface of the associated conductive landing area of the final level 114. The solder 130 extends along the sides of the respective conductive terminals 109.

As further shown in FIGS. 1 and 1C, the confinement features 116 have circular or ring shapes with an interior sidewall extending along the third direction Z that encircles or otherwise laterally surrounds the given respective one of the conductive terminals 109. The confinement features 118 have a dual ring shape with interior sidewalls that encircle or otherwise laterally surround two respective conductive terminals 109 of the die 108. The interior (e.g., inwardly facing) sidewalls of the respective confinement features 116 and 118 laterally confine the solder 130, for example, during thermal reflow processing after the die 108 is placed on the multilevel package substrate 110. In addition, the interior sidewalls of the respective confinement features 116 and 118 can laterally engage and confine a respective one of the conductive terminals 109 of the die 108, for example, during placement and/or solder reflow, to facilitate desired alignment of the die 108 relative to the multilevel package substrate 110.

As best shown in FIGS. 1 and 1B, the example electronic device 100 includes passive electronic components 131, 132 and 133. In one example, the respective passive electronic components 131, 132 and 133 are two-terminal devices such as surface mount technology (SMT) resistors, capacitors and/or diodes. Other implementations can include passive components having more than two terminals. As shown in FIG. 1B, the passive components 131 and 132 include conductive terminals at opposite ends of the rectangular component body, and the terminals are electrically coupled to a respective conductive landing area of the final level 114 of the multilevel package substrate 110 by solder 130. In another implementation, the elevated trace layer can include confinement features (not shown) to laterally confine solder and/or a side of a passive component.

Figure 2:
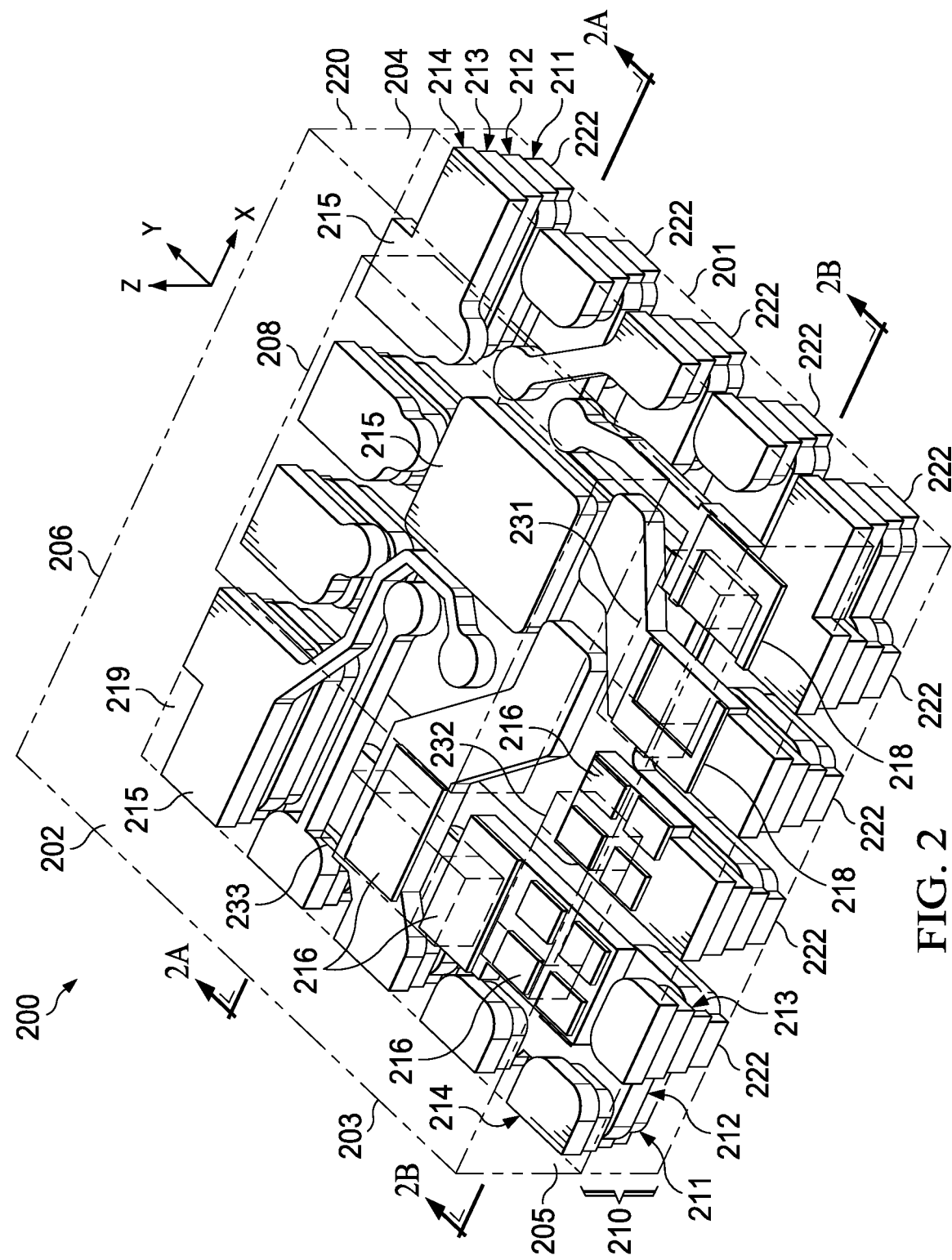
FIG. 2 is a top perspective view of another packaged electronic device having a multilevel package substrate with a conductive elevated trace layer that includes confinement features with sidewalls for solder confinement of soldered passive components according to another embodiment.
Figure 2A:
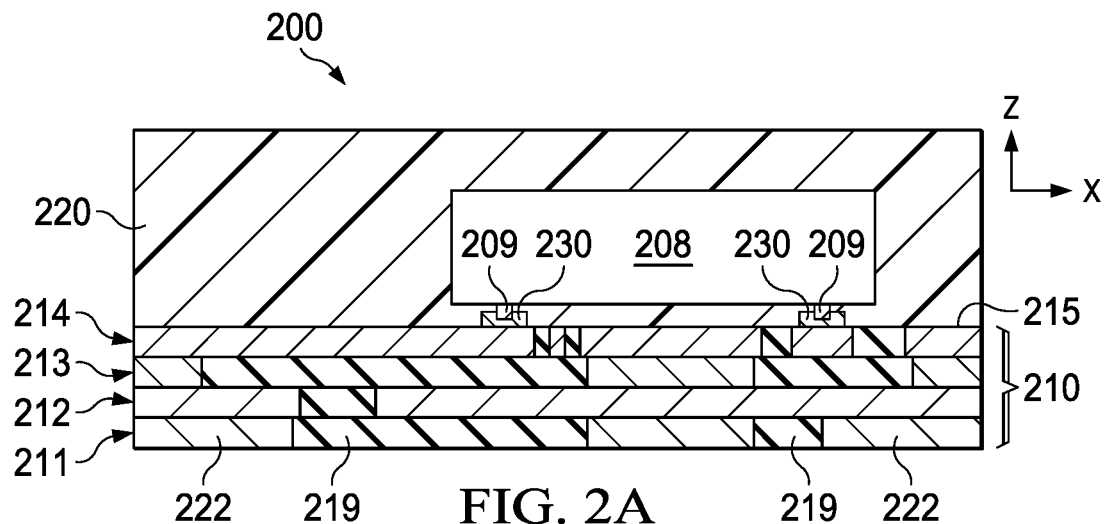
FIG. 2A is a partial sectional side elevation view of the electronic device taken along line 2A-2A of FIG. 2.
Figure 2B:
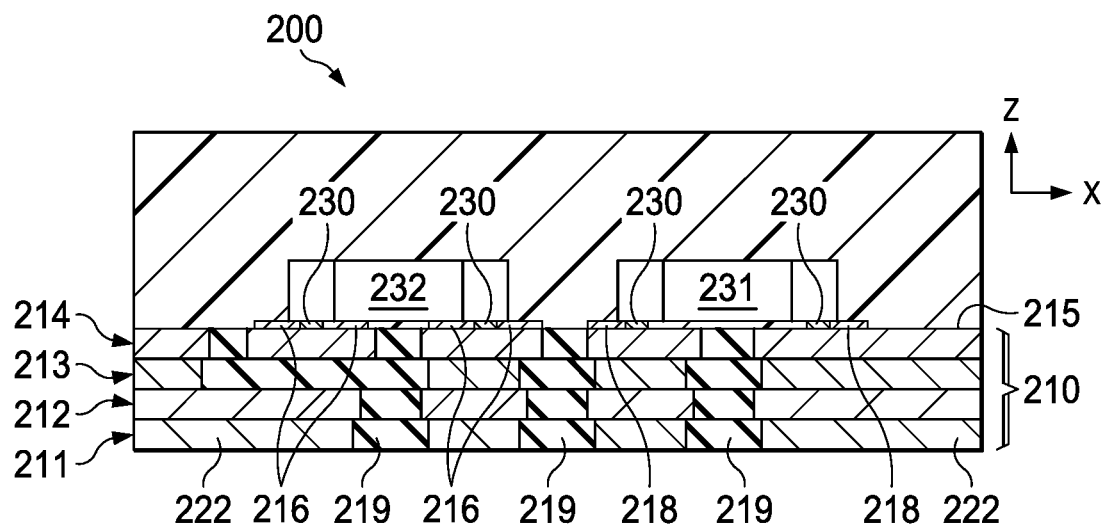
FIG. 2B is a partial sectional side elevation view of the electronic device taken along line 2B-2B of FIG. 2.
Figure 2C:
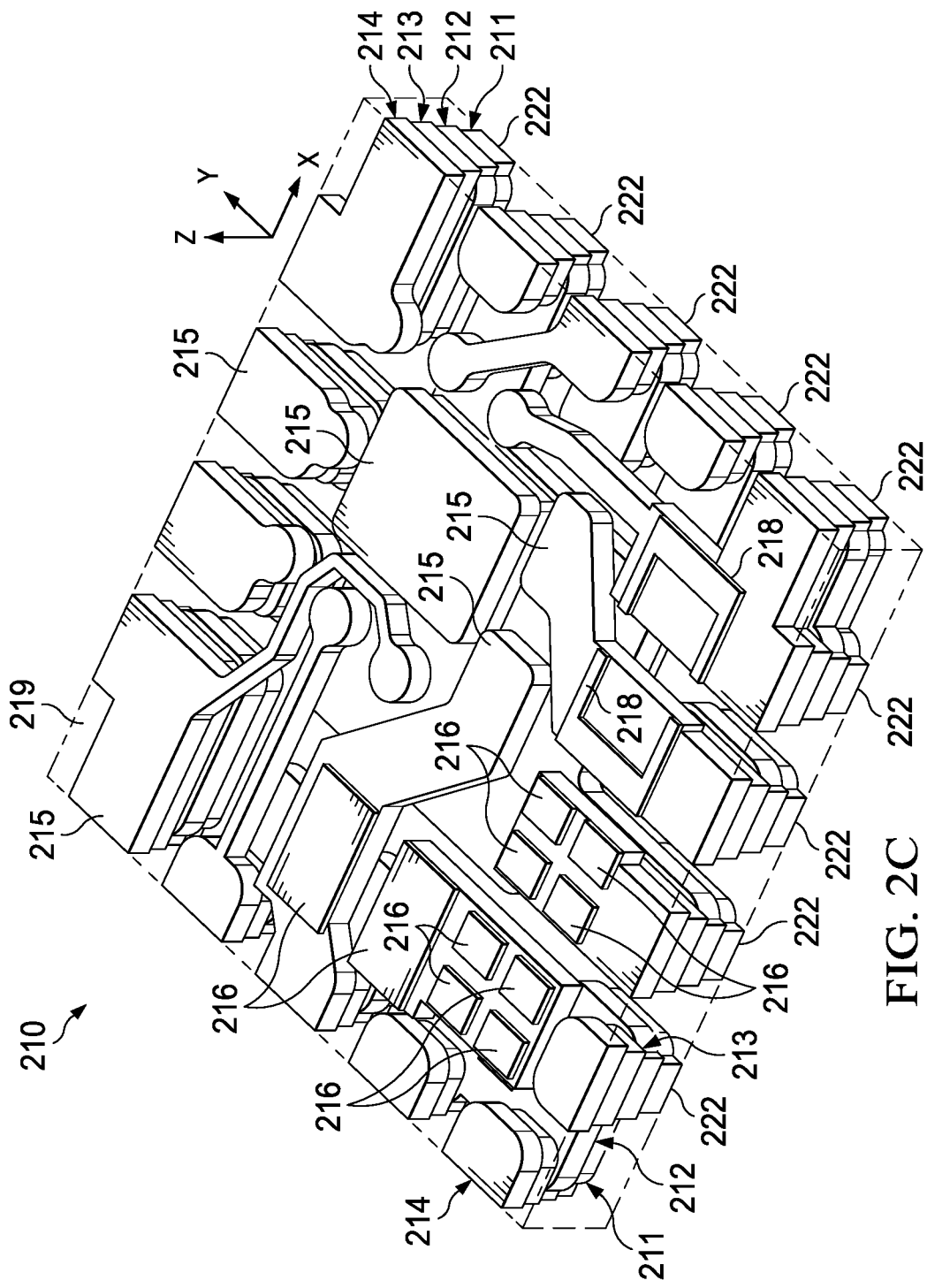
FIG. 2C is a top perspective view of the multilevel package substrate of the electronic device of FIG. 2.

FIGS. 2-2C show another example packaged electronic device 200 that includes a multilevel package substrate with a conductive elevated trace layer that includes confinement features with sidewalls for solder confinement of soldered passive components according to another embodiment. The electronic device 200 has opposite first and second sides 201 and 202, opposite third and fourth sides 203 and 204, and opposite fifth and sixth sides 205 and 206, respectively. The electronic device 200 includes a semiconductor die 208 with conductive terminals 209 (e.g., FIG. 2A) and flip-chip soldered to respective conductive landing areas (e.g., patterned conductive surfaces) of a final level of a multilevel package substrate 210. The multilevel package substrate 210 has a first level 211, a second level 212, a third level 213, and a final (e.g., fourth) level 214. In other implementations, the multilevel package substrate 210 has any integer number N levels, where N is greater than 1. The levels 211-214 extend in respective X-Y planes in the illustrated orientation and form a stacked arrangement along the Z direction. The final level 214 has an upper side 215 that forms a top side of the multilevel package substrate 210 and includes a die attach pad beneath the die 208. The multilevel package substrate 210 has a conductive elevated trace layer with confinement features 216 and 218 that extend outward (e.g., upward) from the side 215 of the final level 214 along the third direction Z. The multilevel package substrate 210 includes dielectric electrically insulating material 219 within and between patterned conductive features of the levels 211-214. The electronic device 200 has a package structure 220, such as a plastic molded material that encloses the die 208 and a portion of the multilevel package substrate 210, and the package structure 220 exposes portions of the first level 211.

The first level 211 extends in a first X-Y plane at the bottom of the stacked arrangement, and an includes patterned conductive features having bottom sides exposed along a bottom of the multilevel package substrate 210, some of which are conductive leads 222. The final level 214 has conductive landing areas along the side 215. The side 215 of the final level 214 extends in another X-Y plane. In the illustrated example, the die 208 is flip-chip mounted to the multilevel package substrate 210 (e.g., FIG. 2A) with conductive terminals 209 of the die 208 electrically coupled to respective ones of the conductive leads 222 through the conductive traces and routing features of the multilevel package substrate 210. The conductive terminals 209 of the die 208 are soldered to respective conductive landing areas on corresponding portions of the side 215 of the final level 214 of the multilevel package substrate 210 via solder 230. The solder 230 extends along the sides of the respective conductive terminals 209 as shown in FIG. 2A. The solder 230 may extend between bottom surface of some or all of the conductive terminals 209 of the die 208 and the upper surfaces of the conductive landing areas on corresponding portions of the side 215 and/or the bottom surface of one or more of the conductive terminals 209 of the die 208 can be in direct contact with the upper surface of the associated conductive landing area of the final level 214.

As best shown in FIG. 2, the example electronic device 200 includes passive electronic components 231, 232 and 233. In one example, the respective passive electronic components 231, 232 and 233 are two-terminal devices such as surface mount technology (SMT) resistors, capacitors and/or diodes. Other implementations can include passive components having more than two terminals. As shown in FIG. 2B, the passive components 231 and 232 include conductive terminals at opposite ends of the rectangular component body, and the terminals are electrically coupled to a respective conductive landing area of the final level 214 of the multilevel package substrate 210 by solder 230. As further shown in FIGS. 2 and 2C, the elevated trace layer includes confinement features 216 and 218 to laterally confine solder and/or a side of a passive component. In one example, the confinement features 216 and 218 have a thickness along the third direction Z of 30 µm+/−3 µm. The confinement features 216 and 218 in this example have respective sidewalls that provide solder arrest or confinement structures that laterally confine the solder 230 between the passive component 231, 232, 233 and the respective one of the conductive landing areas.

The confinement features 218 in FIGS. 2 and 2C each have a U-shape that laterally surrounds three sides of a respective conductive terminal of the passive component 231. This structure provides lateral confinement of the solder 230 and/or a side of the passive component 231. The confinement features 216 include sets of four rectangular structures of the elevated trace layer to provide cross-shaped channels for confining the solder 230 for mounting the respective conductive terminals of the passive component 232. In this example, four rectangular conductive features are laterally spaced apart from one another between a respective conductive terminal of the passive component 231, 232, 233 and the respective one of the conductive landing areas. The elevated trace layer in this example includes larger rectangular confinement features 216 for each of the conductive terminals of the passive component 233. In other example, the confinement feature 216 includes multiple portions of any suitable shape that are laterally spaced apart from one another between a terminal of the passive component and a respective one of the conductive landing areas of the multilevel package substrate 210. In other examples, the confinement features 216 and/or 218 associated with the passive components 231-232 can be used alone or in further combination with one or more confinement features of the elevated trace layer that are associated with one or more respective conductive terminals 209 of the die 208 (e.g., the confinement features 116 and/or 118 in FIGS. 1, 1A, and 1C above). The confinement features 116, 118, 216 and/or 218 facilitate component adhesion integrity and reduced risk of delamination while promoting bigger solder to copper surface contact area in the packaged electronic devices 100 and 200.

Figure 3:
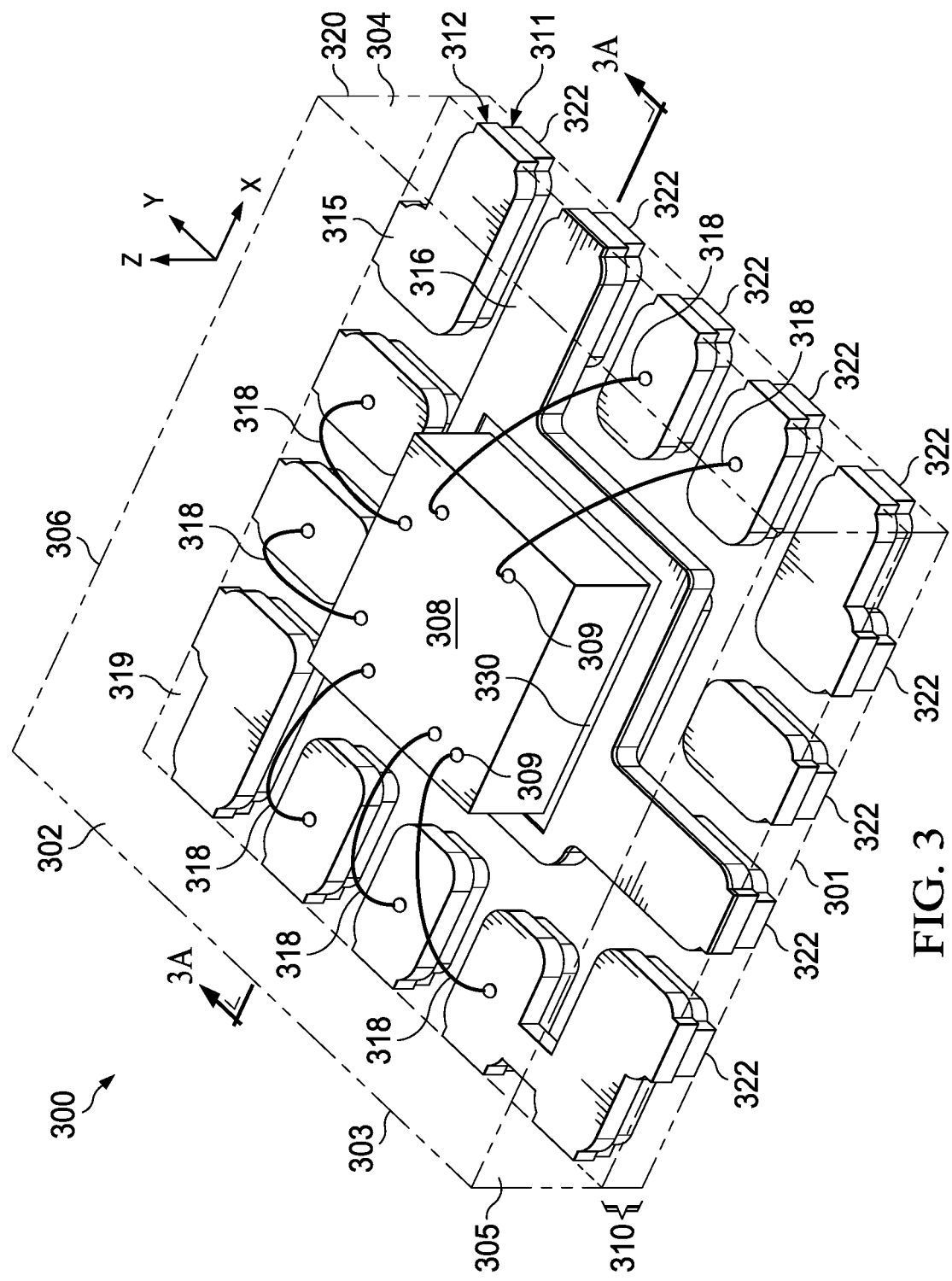
FIG. 3 is a top perspective view of another packaged electronic device having a multilevel package substrate with a conductive elevated trace layer that includes a confinement feature with sidewalls for solder and die confinement of a semiconductor die soldered to the multilevel package substrate according to a further embodiment.
Figures 3A, 3B:
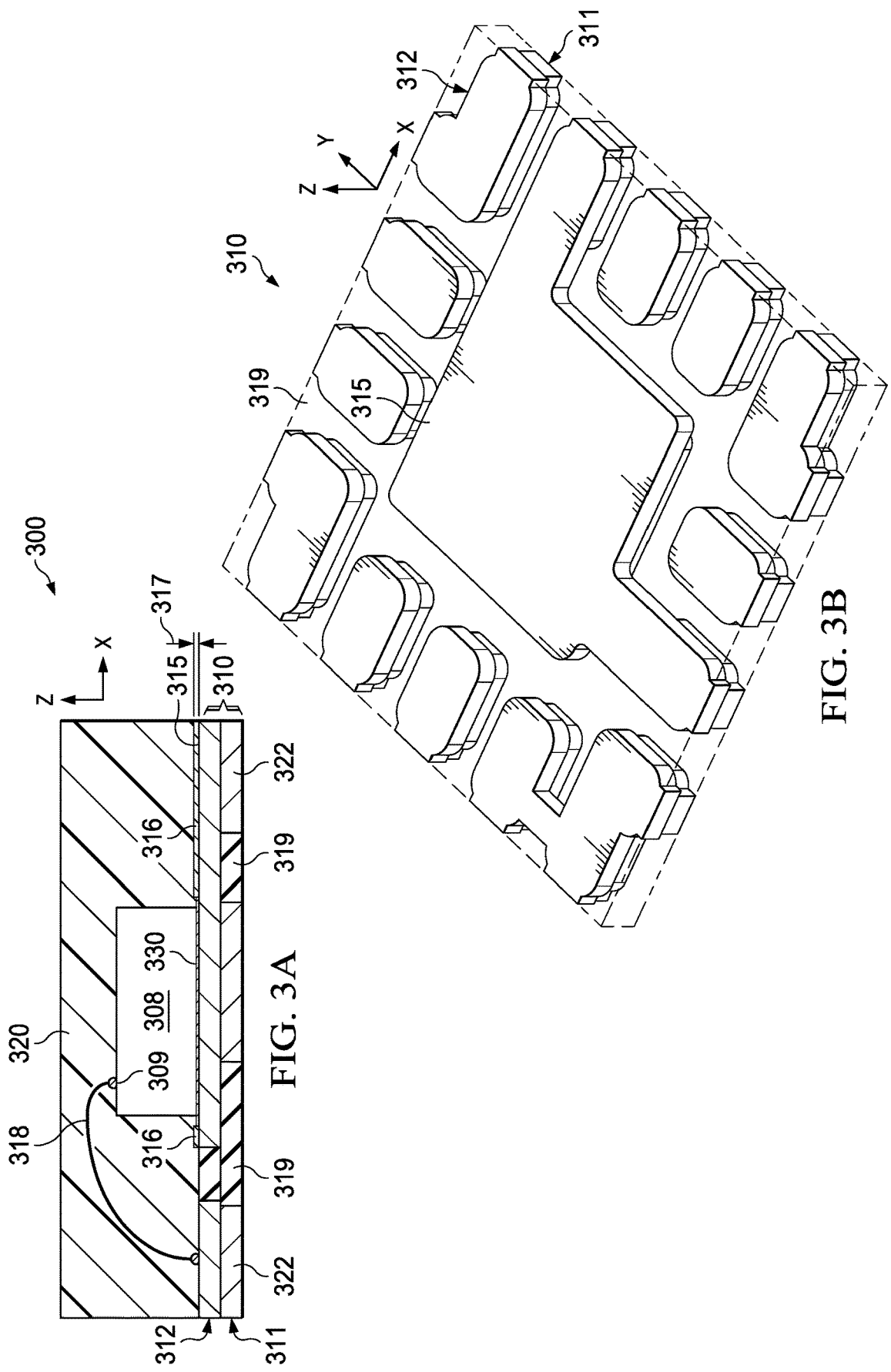
FIG. 3A is a partial sectional side elevation view of the electronic device taken along line 3A-3A of FIG. 3.
FIG. 3B is a top perspective view of the multilevel package substrate of the electronic device of FIG. 3 prior to formation of the conductive elevated trace layer.
Figure 3C:
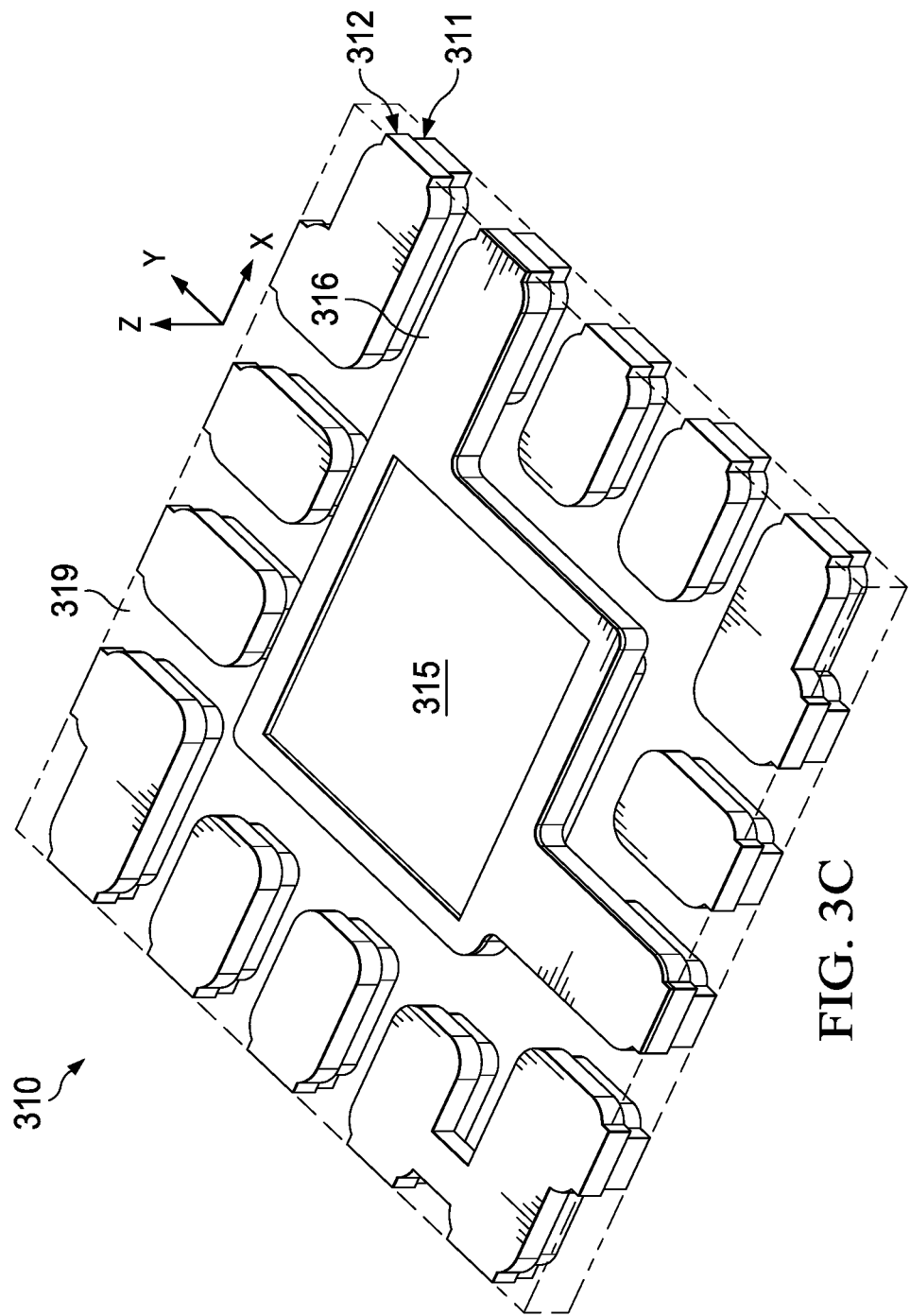
FIG. 3C is a top perspective view of the multilevel package substrate of the electronic device of FIG. 3 after formation of the conductive elevated trace layer.
Figure 3D:
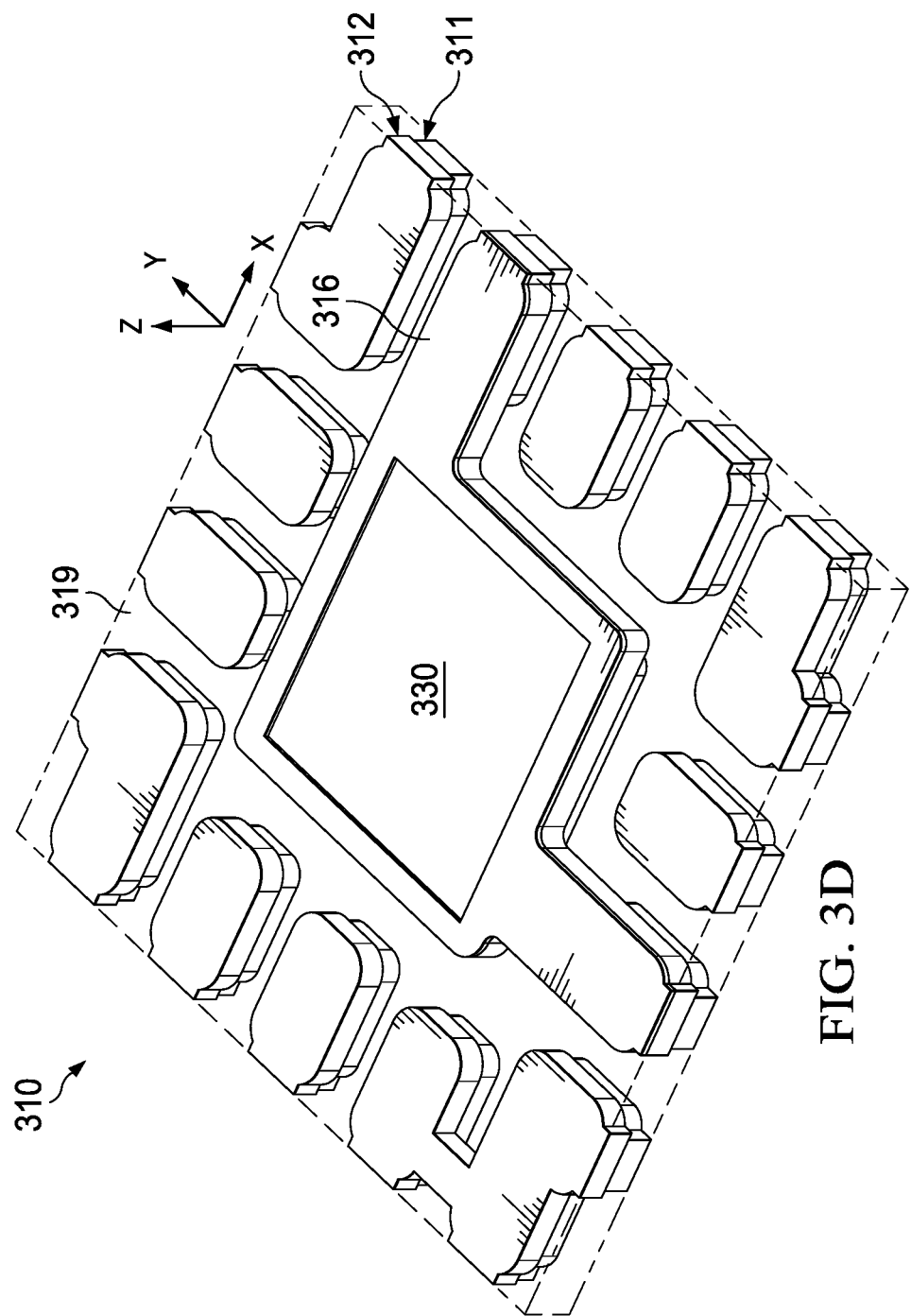
FIG. 3D is a top perspective view of the multilevel package substrate of the electronic device of FIG. 3 after adhesive is dispensed.

FIGS. 3-3D show another packaged electronic device 300 with a multilevel package substrate with a conductive elevated trace layer that includes a confinement feature with sidewalls for solder and die confinement of a semiconductor die soldered to the multilevel package substrate according to a further embodiment. The electronic device 300 has opposite first and second (e.g., bottom and top) sides 301 and 302, opposite third and fourth (e.g., left and right) sides 303 and 304, and opposite fifth and sixth (e.g., front and back) sides 305 and 306, respectively. The electronic device 300 includes a semiconductor die 308 with conductive terminals 309 (e.g., metal pillars or bond pads) along a top side of the die 308. The conductive terminals 309 are electrically coupled by bond wires 318 to respective conductive landing areas (e.g., patterned conductive surfaces) of a final level 312 of a multilevel package substrate 310, such as by bond wire connections to respective leads 322 of the multilevel package substrate 310. The bottom side of the die 308 is attached to a die pad or other support structure of the multilevel package substrate 310 by an adhesive 330. In another example, solder, such as a dispensed solder paste is used instead of the adhesive 330 to mount the die 308 to the final level 312 of the multilevel package substrate 310. The multilevel package substrate 310 has a first level 311 and a second (e.g., final) level 312. In other implementations, the multilevel package substrate 310 has any integer number N levels, where N is greater than 1. The levels 311-312 extend in respective X-Y planes in the illustrated orientation and form a stacked arrangement along the Z direction.

The final level 312 of the multilevel package substrate 310 has an upper side 315 that forms a top side of the multilevel package substrate 310 and includes the die attach pad beneath the die 308. The multilevel package substrate 310 has a conductive elevated trace layer with a confinement feature 316 that extends outward (e.g., upward) from the side 315 of the final level 312 along the third direction Z. The multilevel package substrate 310 includes dielectric electrically insulating material 319 within and between patterned conductive features of the levels 311 and 312. The electronic device 300 has a package structure 320, such as a plastic molded material that encloses the die 308 and a portion of the multilevel package substrate 310, and the package structure 320 exposes portions of the first level 311. The first level 311 extends in a first X-Y plane at the bottom of the stacked arrangement, and an includes patterned conductive features having bottom sides exposed along a bottom of the multilevel package substrate 310, some of which are conductive leads 322. The final level 312 has conductive landing areas along the side 315. The side 315 of the final level 312 extends in another X-Y plane.

FIG. 3A shows a sectional side elevation view of the electronic device 300 along line 3A-3A of FIG. 3. The elevated trace layer in this example provides an enclosed confinement feature 316 that laterally confines the adhesive and/or a side of the die 308. In one example, the confinement feature 316 has a thickness along the third direction Z of 30 μm+/−3 μm. As shown in FIG. 3B, the top side 315 of the final multilevel package substrate level 312 provides a die attach pad area sized to accommodate the die 308. FIG. 3C shows the multilevel package substrate 310 after formation of the elevated trace layer with the confinement feature 316 that laterally surrounds the die attach pad area of the top side 315 of the final multilevel package substrate level 312. FIG. 3D shows the multilevel package substrate 310 with the adhesive 330 dispensed or otherwise deposited within the laterally enclosed confinement feature 316 over the die attach pad area of the top side 315. The interior sidewalls of the confinement feature 316 help to mitigate die movement and rotation during molding or reflow processing, such as may be caused by unbalanced force in mold flow or wetting of solder or adhesive during reflow or adhesive curing. The interior sidewalls of the confinement feature 316 laterally secure or limit the lateral movement of the die 308 and the adhesive 330 (or solder if used), and the confinement feature sidewalls help ensure the die 308 is secured in place for wire bonding, molding, reflow processing, adhesive curing, etc. This also improves bond line thickness and adhesion integrity and reduces the risk of delamination to improve chip level reliability performance in examples where the die 308 is soldered to the top side 315 of the final multilevel package substrate level 314.

Figure 5:
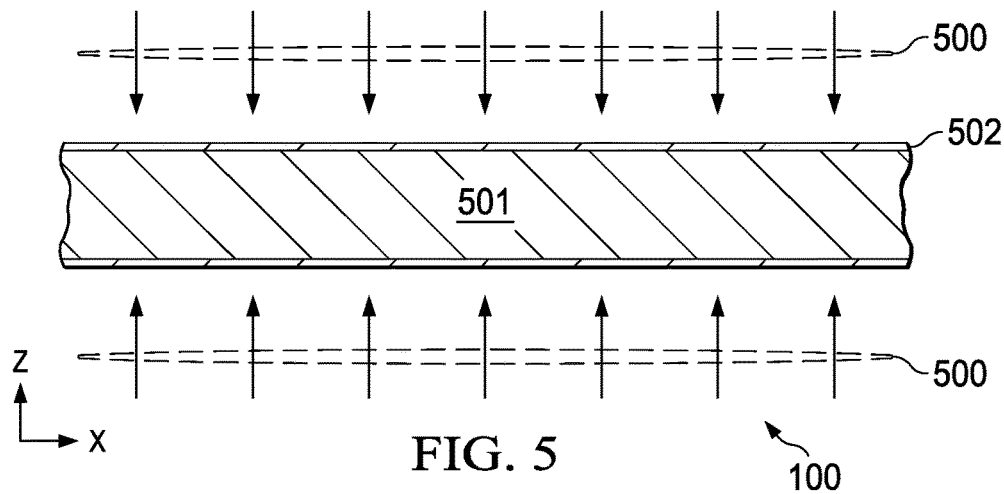
FIGS. 5-30 are partial sectional side elevation views of the electronic device of FIGS. 1-1C undergoing fabrication according to the method of FIG. 4.
Figure 6:
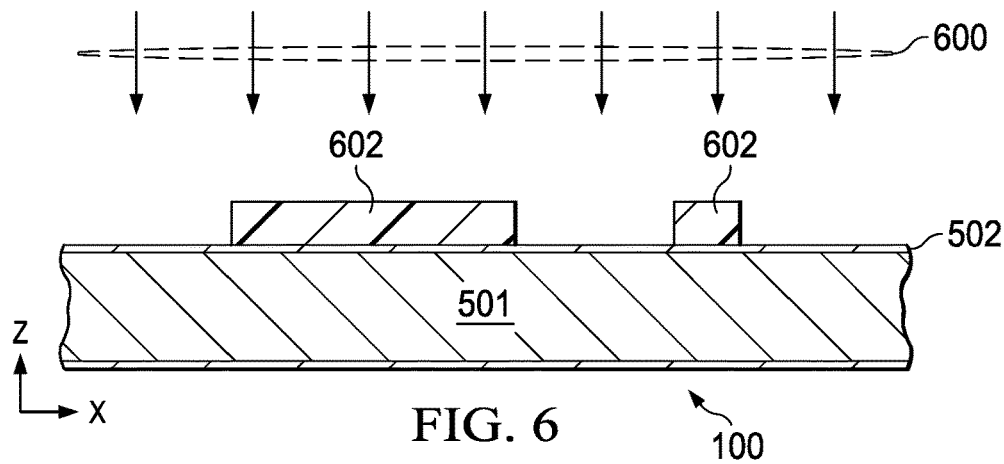
Figure 7:
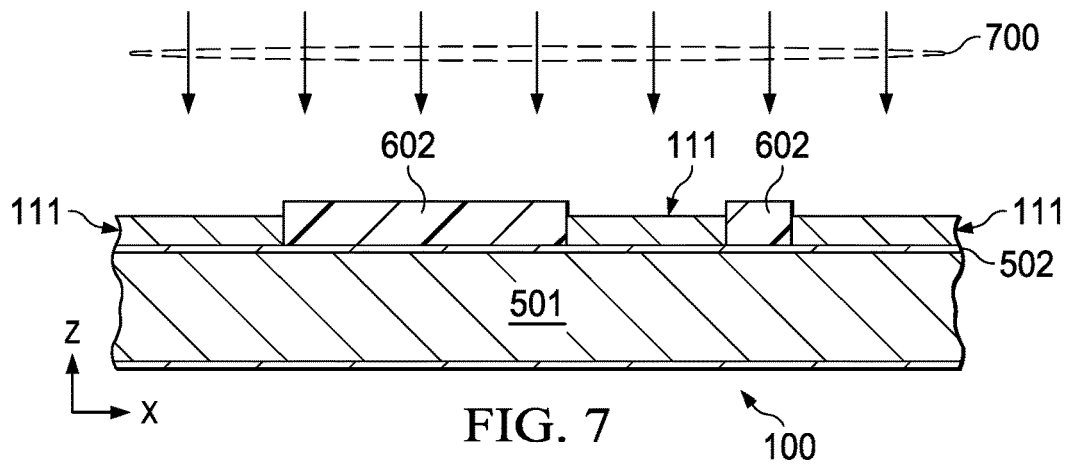
Figure 8:
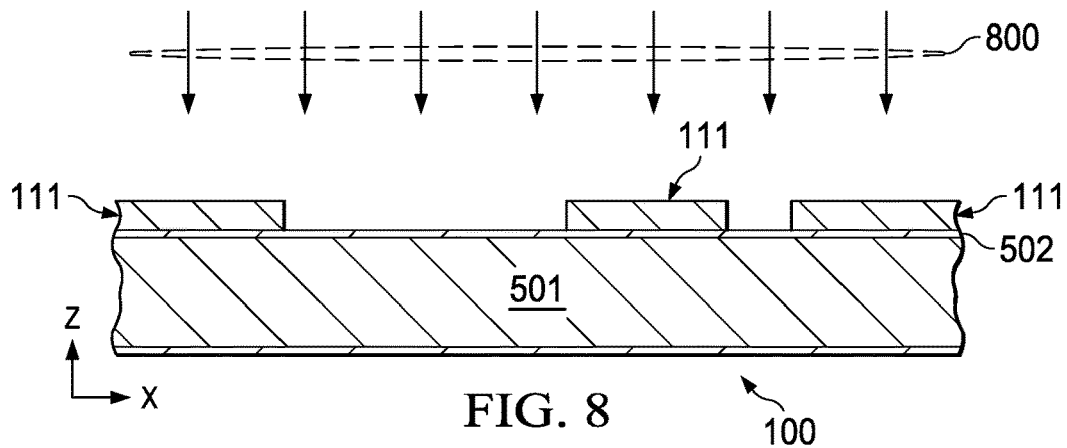

Referring now to FIGS. 4-30, FIG. 4 shows a method 400 of fabricating a packaged electronic device, and FIGS. 5-30 show sectional side views of the electronic device 100 of FIGS. 1-1C undergoing fabrication according to the method 400. The method 400 begins with fabricating the multilevel package substrate 110 at 402-442, including the first level 111 extending in the first X-Y plane with the conductive leads 122, and the final level 114 with the conductive landing areas along the side 115 that extends in another X-Y plane as described above. The levels 111-114 in one example are built one at a time starting with deposition of a seed copper layer on a metal carrier at 402. FIG. 5 shows one example, in which a chemical vapor deposition process 500 is performed that deposits a copper seed layer 502 on a metal carrier 501. The process 500 in one example deposits the copper seed layer on both the top and bottom sides of the carrier 501 in the illustrated orientation. The method 400 continues at 404 with deposition and patterning of a first plating mask. FIG. 6 shows one example, in which a process 600 is performed that deposits and patterns a first plating mask 602 on the copper seed layer 502 on the top side of the carrier 501. The method 400 continues at 406 in FIG. 4 with electroplating copper features of a first trace layer. FIG. 7 shows one example, in which an electroplating process 700 is performed that deposits copper in the exposed areas of the mask 602 to form copper features of the first level 111 on the exposed portions of the copper seed layer 502 on the top side of the carrier 501. At 408, the first plating mask is removed. FIG. 8 shows one example, in which a process 800 is performed to remove the first plating mask and leave the plated copper structures of the first level 111.

Figure 9:
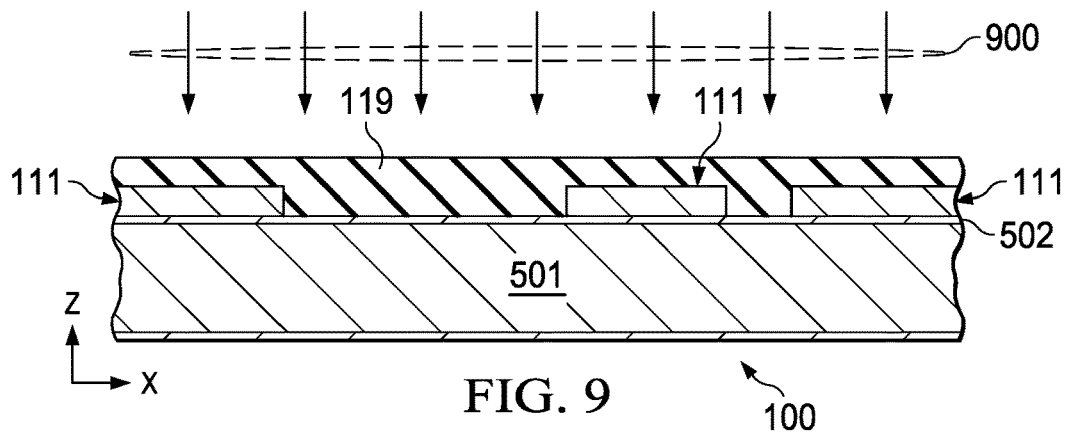
Figure 10:
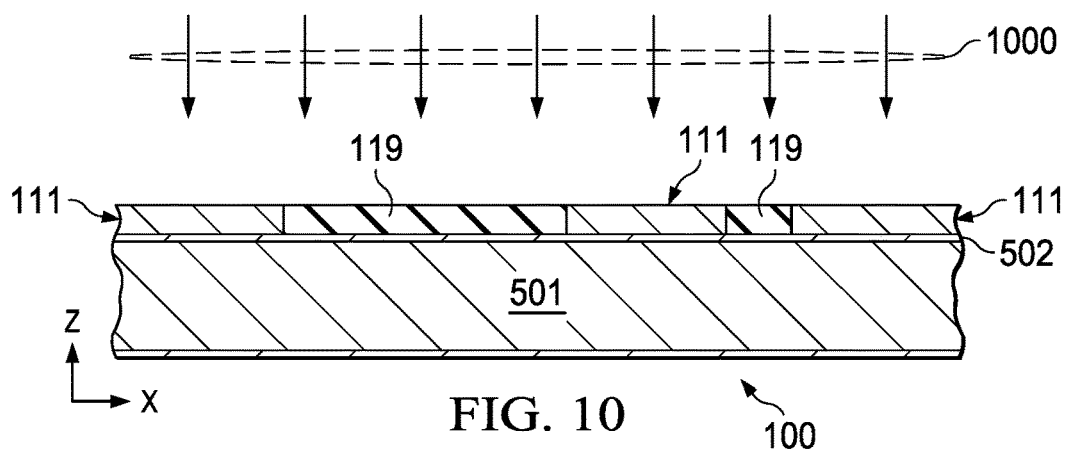

The method 400 continues with compression molding at 410 for the first level. FIG. 9 shows one example, in which a compression molding process 900 is performed that compression molds a first layer of the dielectric electrically insulating material 119 between and over the patterned conductive features of the first level 111. A grinding operation is performed at 412. FIG. 10 shows one example, in which a grinding process 1000 is performed that grinds and planarizes the top side of the structure. The grinding process 1000 removes an upper portion of the compression molded dielectric electrically insulating material 119 to expose upper portions of the conductive features of the first level 111, and the grinding process 1000 is continued to reduce the thickness of the conductive copper and dielectric features of the first level 111 to a final thickness along the third direction Z as shown in FIG. 10.

The second and subsequent levels 112-114 are fabricated in the same or a similar sequence in one example. In another example, the conductive copper features of the second level 112 are deposited by electroplating using a second plating mask prior to the compression molding at 410, but this approach requires that the conductive features of the second level 112 be no wider than underlying conductive features of the first level 111. This is not the case for the conductive features of the first and second levels 111 and 112, and the illustrated example includes the compression molding 410 and grinding at 412 prior to forming the second level 112.

Figure 11:
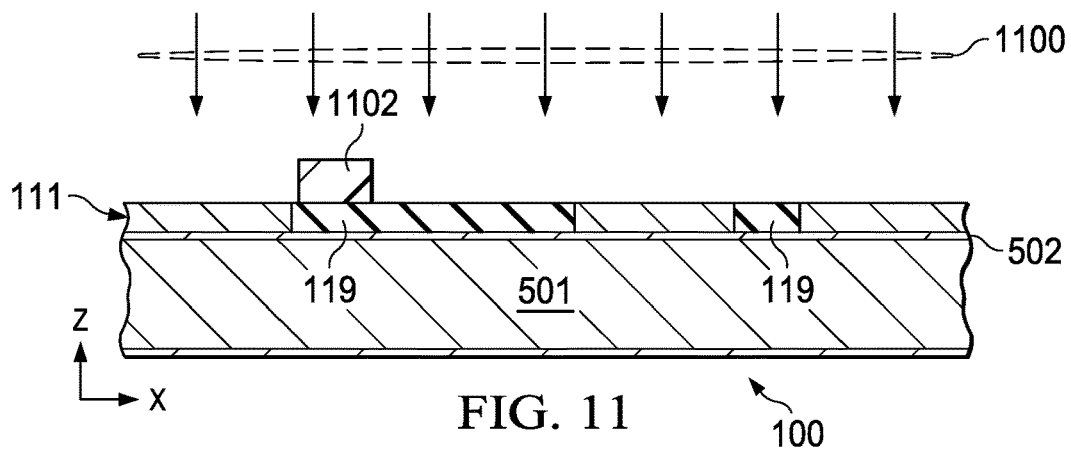
Figure 12:
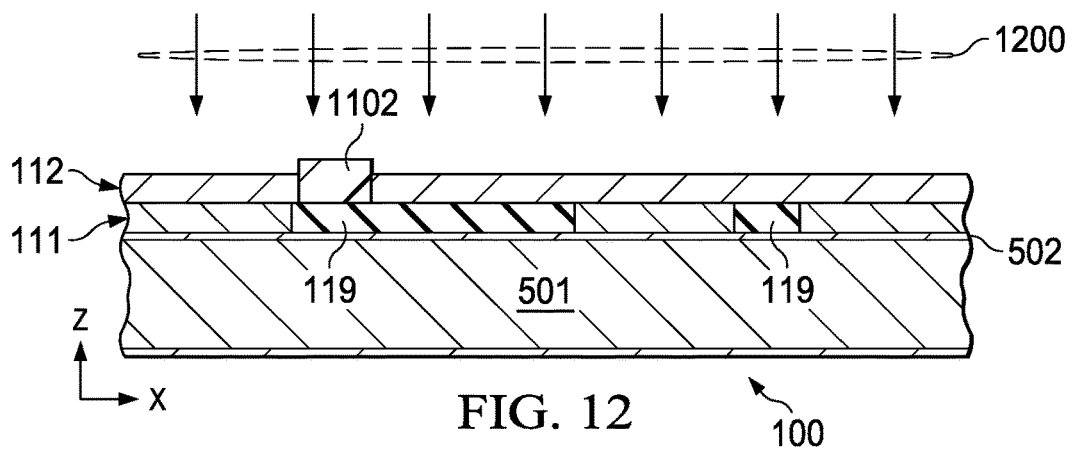
Figure 13:
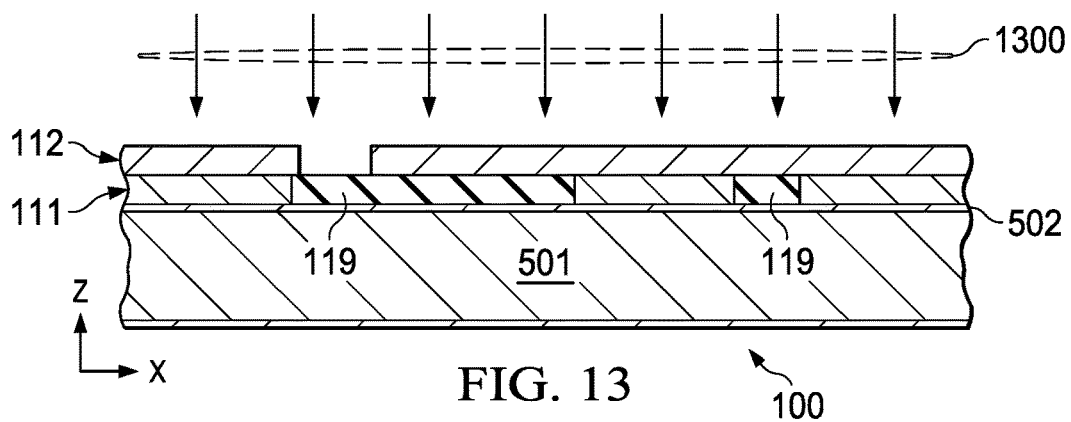
Figure 14:
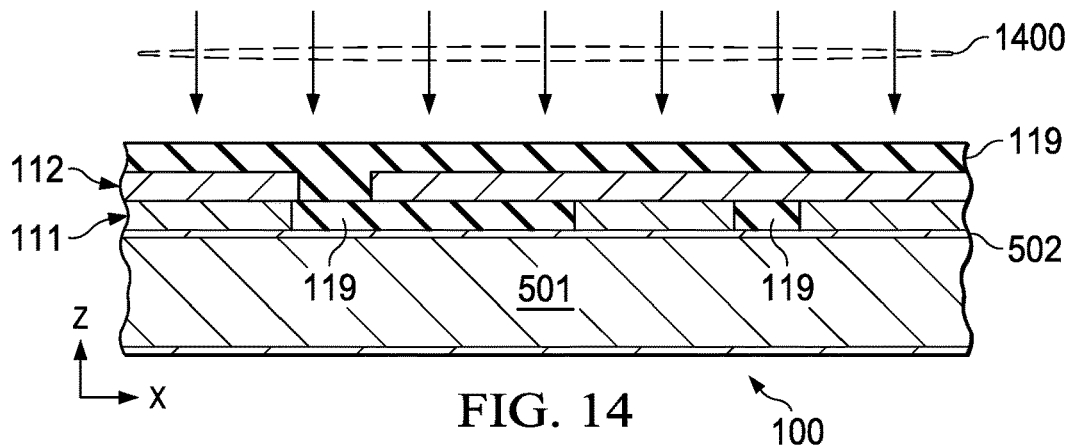
Figure 15:
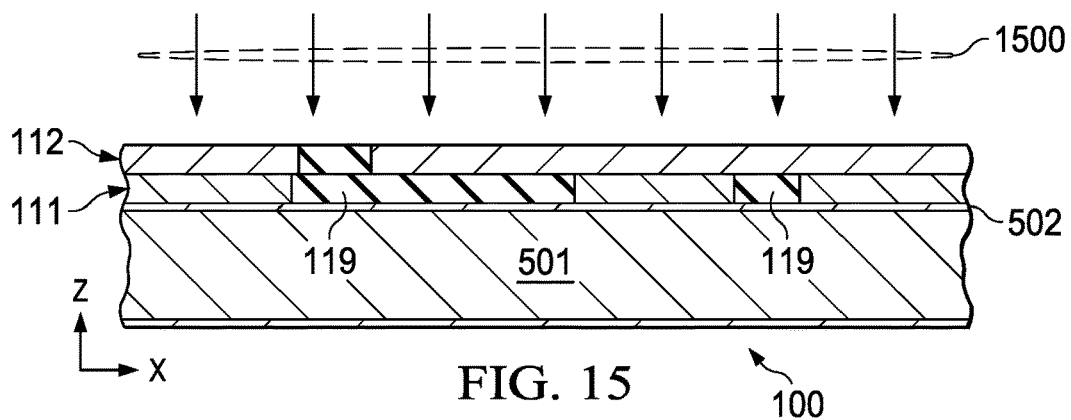

The second level construction begins at 414 with deposition and patterning of a second plating mask. FIG. 11 shows one example, in which a process 1100 is performed that deposits and patterns a second plating mask 1102 on the top side of the first level 111. The method 400 continues at 416 in FIG. 4 with electroplating copper features of a second trace layer. FIG. 12 shows one example, in which an electroplating process 1200 is performed that deposits copper in the exposed areas of the mask 1102 to form copper features of the second level 112 on the exposed portions of the first level 111. At 418, the second plating mask is removed. FIG. 13 shows one example, in which a process 1300 is performed to remove the second plating mask and leave the plated copper structures of the second level 112. The method 400 continues with compression molding at 420 for the second level. FIG. 14 shows one example, in which a compression molding process 1400 is performed that compression molds a second layer of the dielectric electrically insulating material 119 between and over the patterned conductive features of the second level 112. A grinding operation is performed at 422. FIG. 15 shows one example, in which a grinding process 1500 is performed that grinds and planarizes the top side of the structure. The grinding process 1500 removes an upper portion of the compression molded dielectric electrically insulating material 119 to expose upper portions of the conductive features of the second level 112, and the grinding process 1500 is continued to reduce the thickness of the conductive copper and dielectric features of the second level 112 to a final thickness along the third direction Z as shown in FIG. 15.

Figure 16:
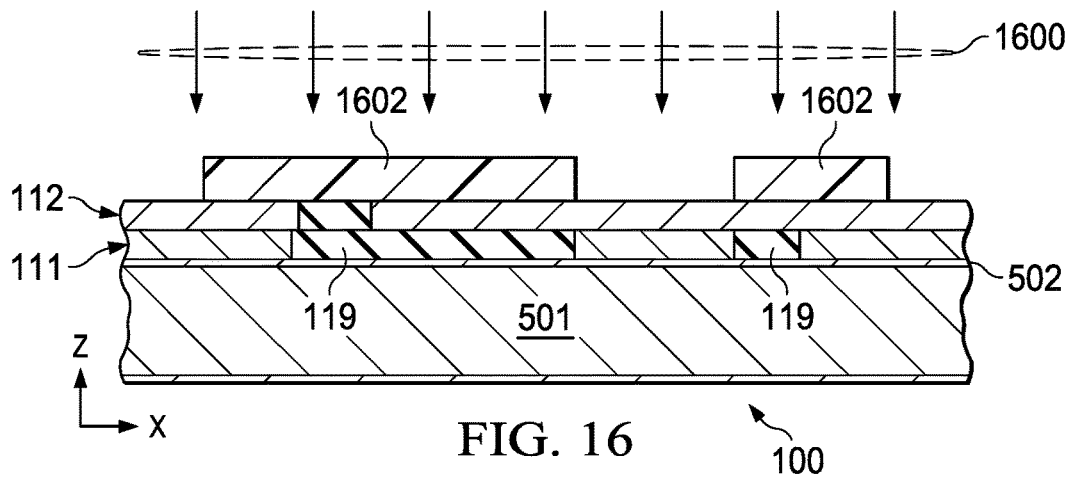
Figure 17:
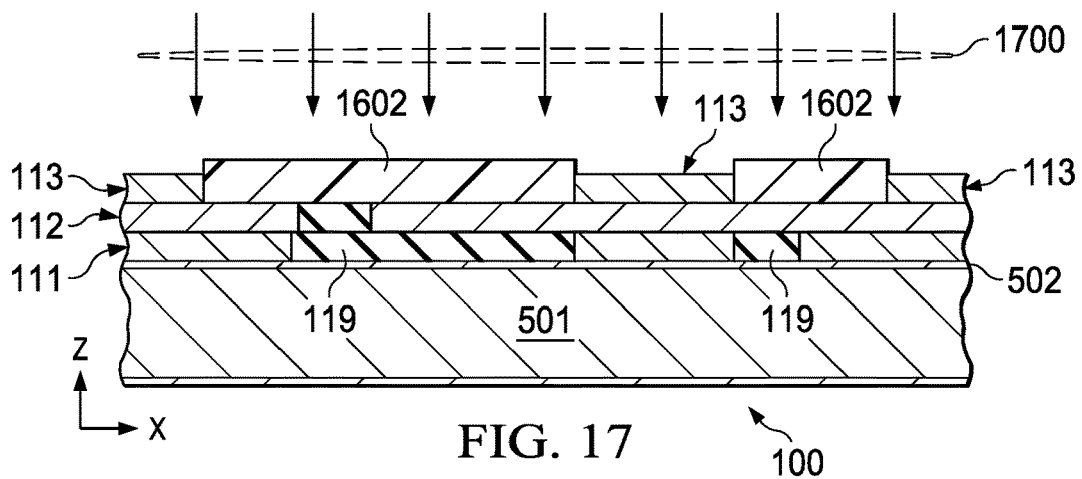
Figure 18:
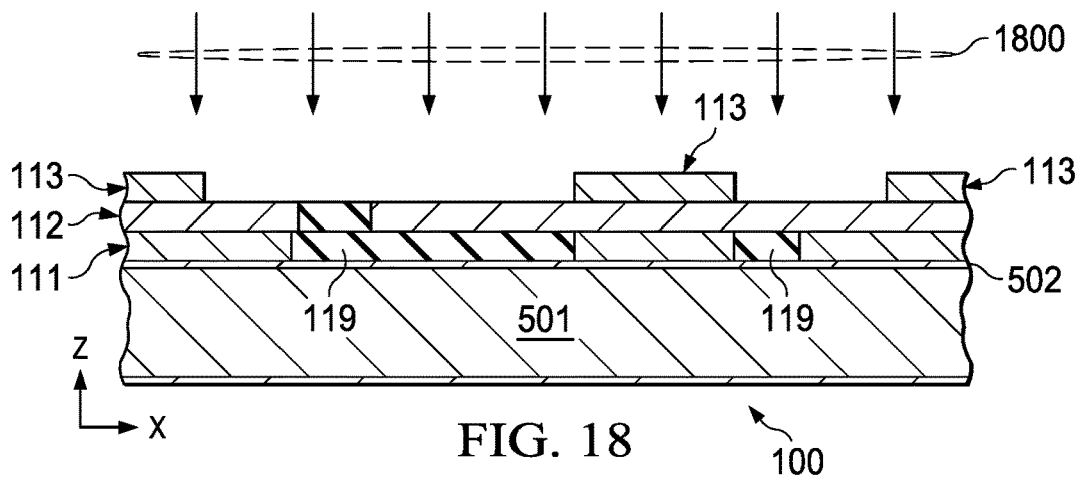

For the illustrated four level example, the third level construction begins at 424 with deposition and patterning of a third plating mask. FIG. 16 shows one example, in which a process 1600 is performed that deposits and patterns a third plating mask 1602 on the top side of the second level 112. The method 400 continues at 426 in FIG. 4 with electroplating copper features of a third trace layer. FIG. 17 shows one example, in which an electroplating process 1700 is performed that deposits copper in the exposed areas of the mask 1602 to form copper features of the third level 113 on the exposed portions of the second level 112. At 428, the third plating mask is removed. FIG. 18 shows one example, in which a process 1800 is performed to remove the third plating mask and leave the plated copper structures of the third level 113.

Figure 19:
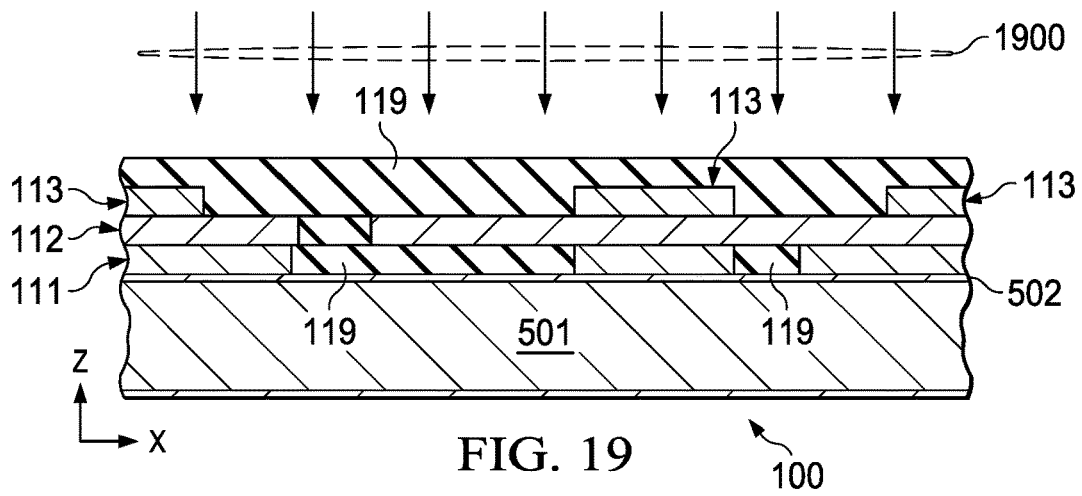
Figure 20:
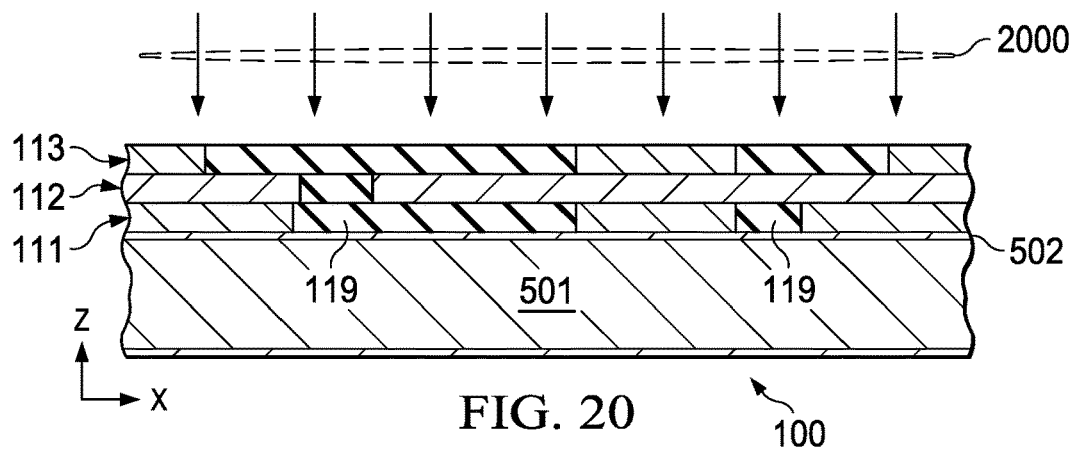

The method 400 continues with compression molding at 430 for the third level. FIG. 19 shows one example, in which a compression molding process 1900 is performed that compression molds a third layer of the dielectric electrically insulating material 119 between and over the patterned conductive features of the third level 113. A grinding operation is performed at 432. FIG. 20 shows one example, in which a grinding process 2000 is performed that grinds and planarizes the top side of the structure. The grinding process 2000 removes an upper portion of the compression molded dielectric electrically insulating material 119 to expose upper portions of the conductive features of the third level 113. The grinding process 2000 is continued to reduce the thickness of the conductive copper and dielectric features of the third level 113 to a final thickness along the third direction Z as shown in FIG. 20.

Figure 4:
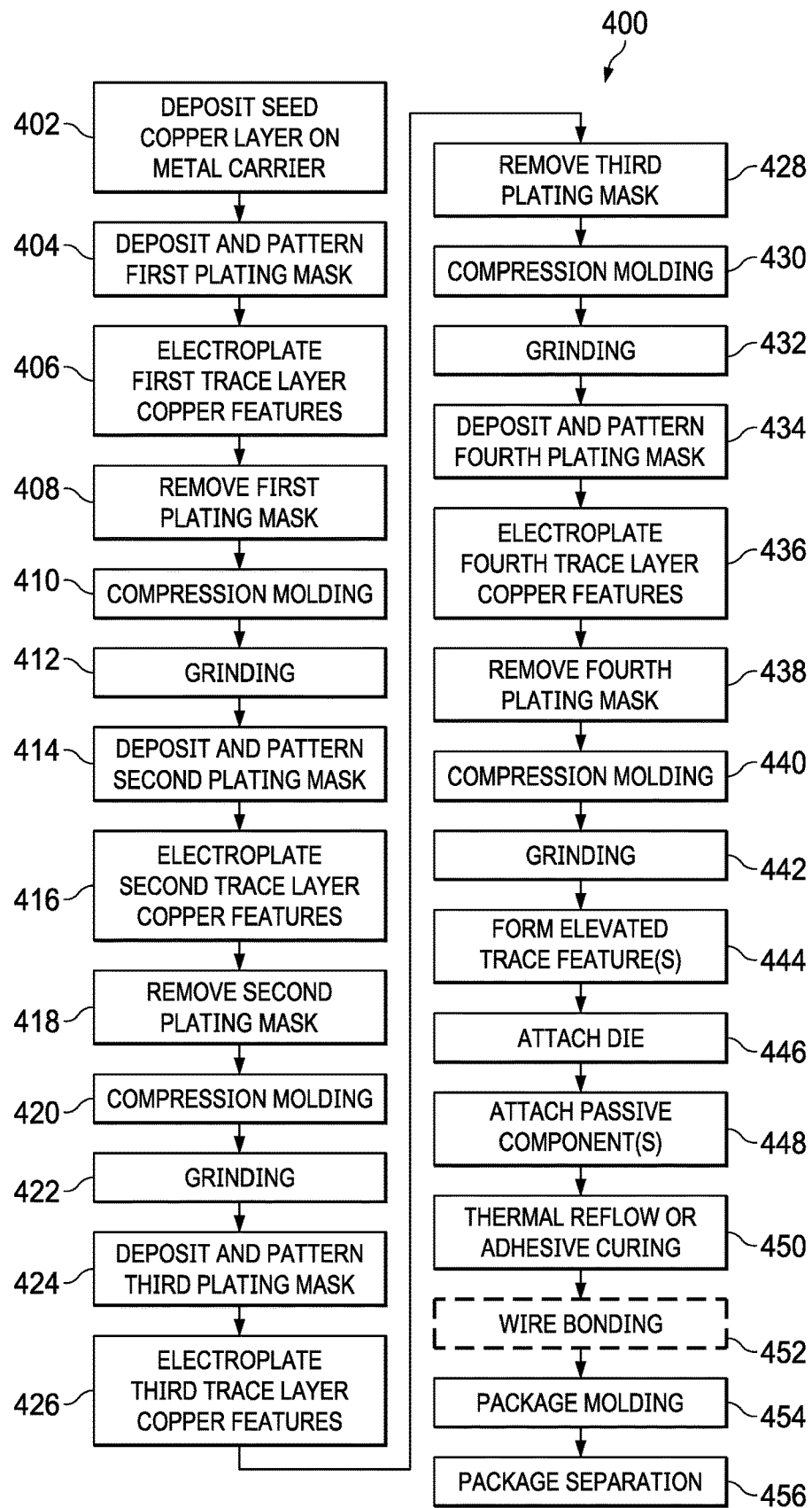
FIG. 4 is a flow diagram of a method of fabricating a packaged electronic device.
Figure 21:
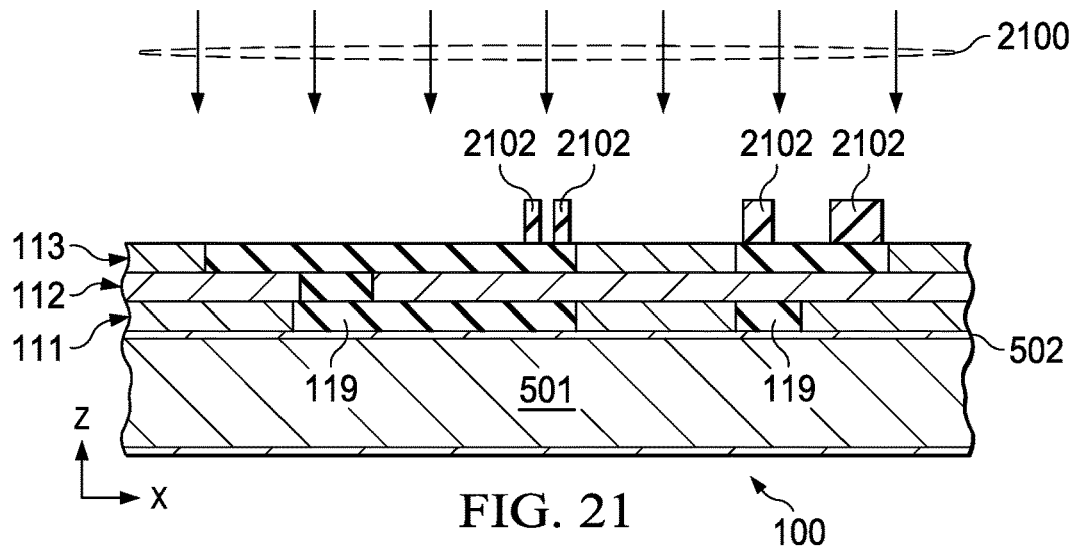
Figure 22:
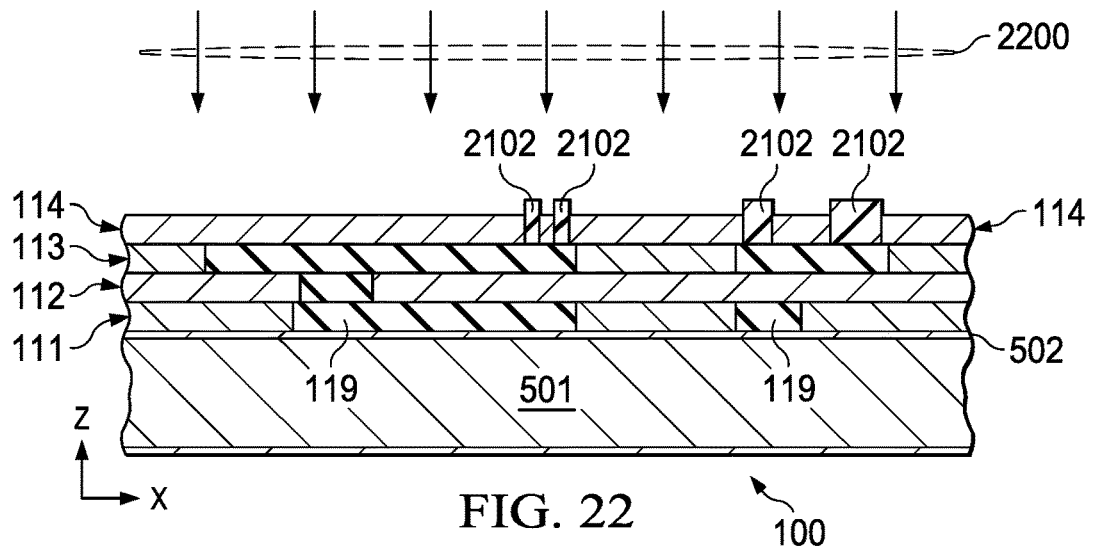
Figure 23:
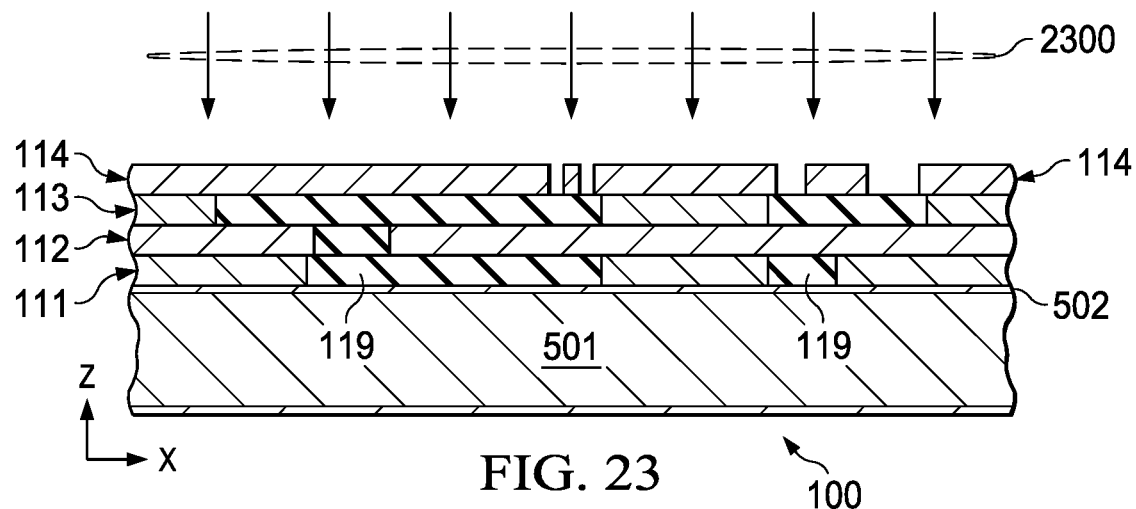
Figure 24:
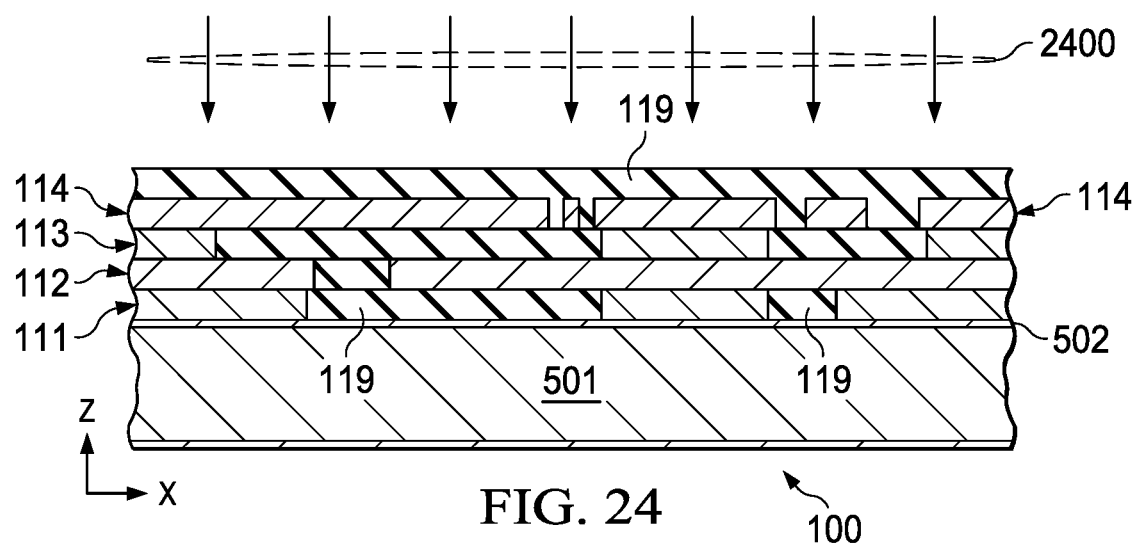
Figure 25:
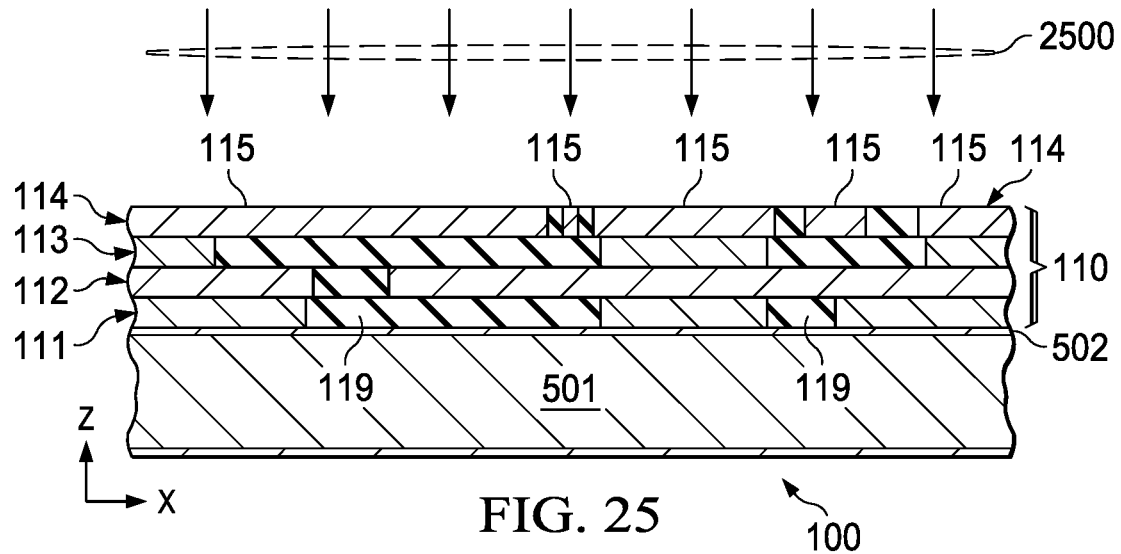

The fourth level construction begins at 434 in FIG. 4 with deposition and patterning of a fourth plating mask. FIG. 21 shows one example, in which a process 2100 is performed that deposits and patterns a fourth plating mask 2102 on the top side of the third level 113. The method 400 continues at 436 in FIG. 4 with electroplating copper features of a fourth trace layer. FIG. 22 shows one example, in which an electroplating process 2200 is performed that deposits copper in the exposed areas of the mask 2102 to form copper features of the fourth level 114 on the exposed portions of the third level 113. At 438, the fourth plating mask is removed. FIG. 23 shows one example, in which a process 2300 is performed to remove the fourth plating mask and leave the plated copper structures of the fourth level 114. The method 400 continues with compression molding at 440 for the fourth level. FIG. 24 shows one example, in which a compression molding process 2400 is performed that compression molds a fourth layer of the dielectric electrically insulating material 119 between and over the patterned conductive features of the fourth level 114. A grinding operation is performed at 442. FIG. 25 shows one example, in which a grinding process 2500 is performed that grinds and planarizes the top side of the structure. The grinding process 2500 removes an upper portion of the compression molded dielectric electrically insulating material 119 to expose upper portions of the conductive features of the fourth level 114. The grinding process 2500 is continued to reduce the thickness of the conductive copper and dielectric features of the fourth level 114 to a final thickness along the fourth direction Z as shown in FIG. 25.

Figure 26:
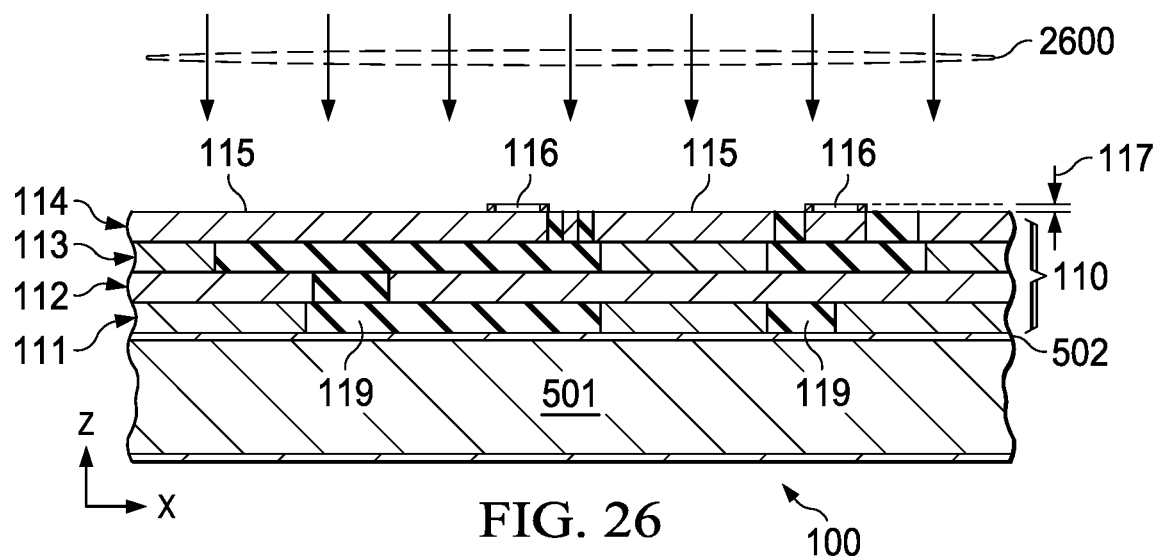
Figure 27:
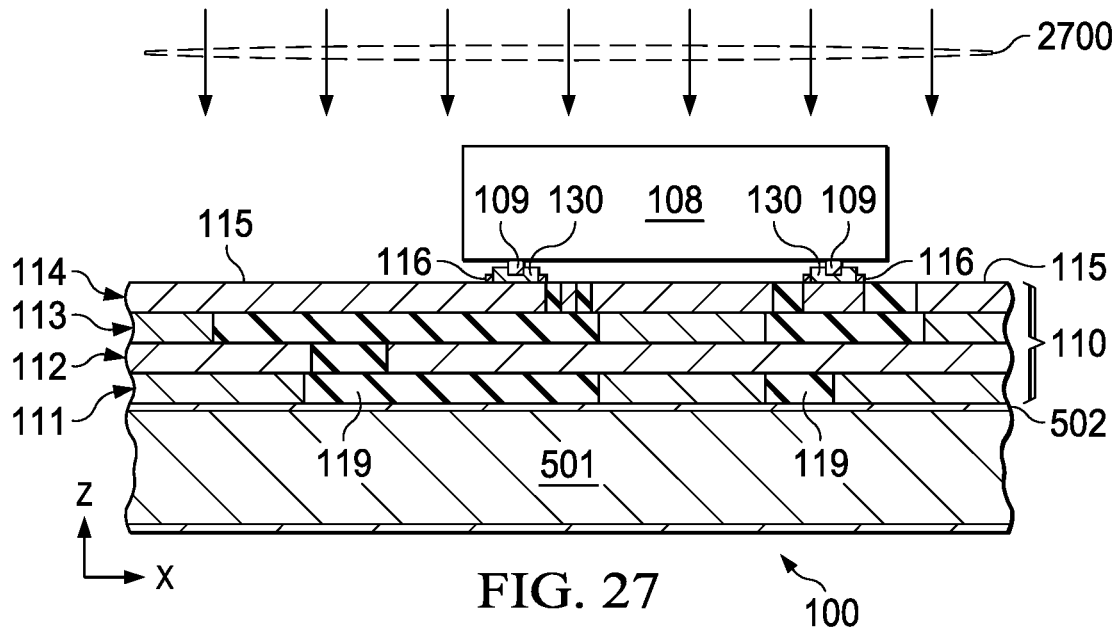
Figure 28:
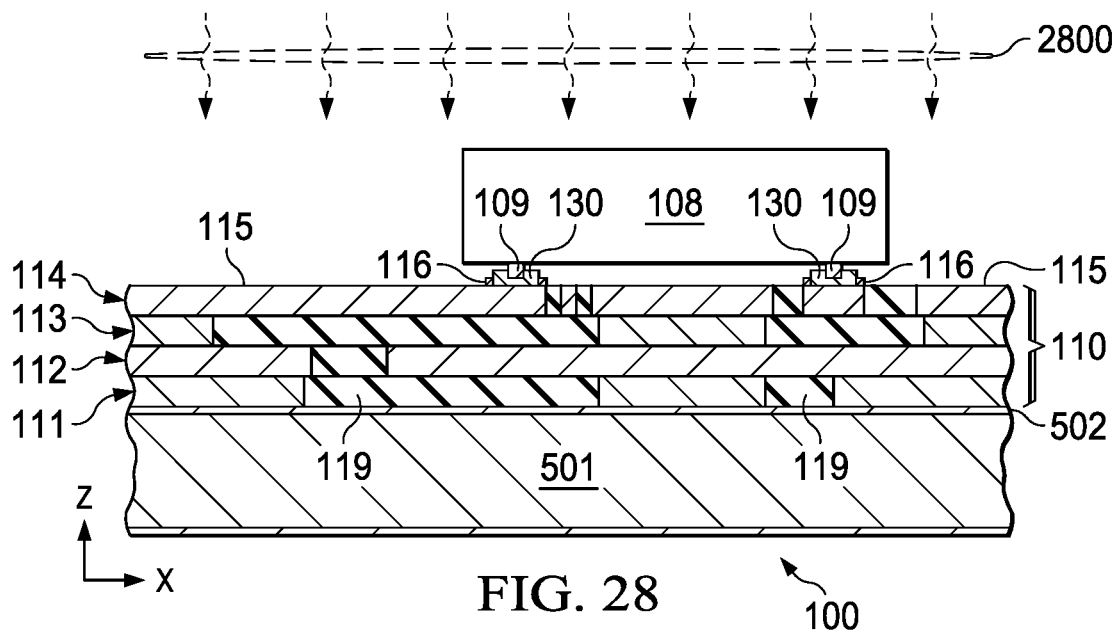
Figure 29:
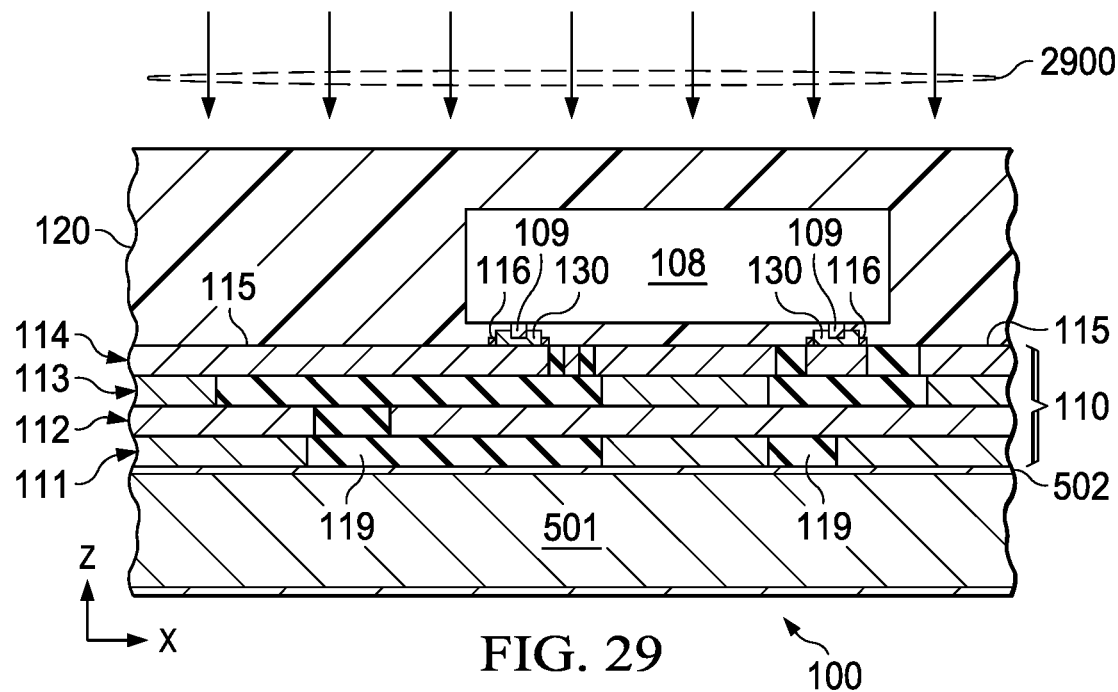
Figure 30:
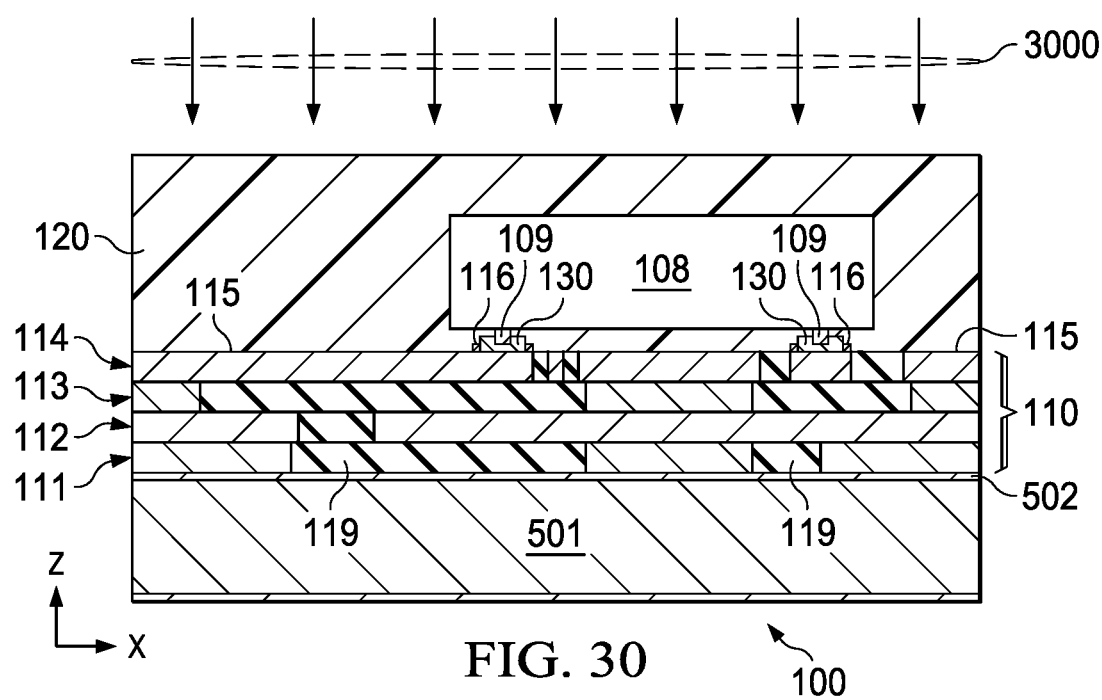

The method 400 continues at 444 with forming the conductive elevated trace layer with the confinement features 116 and 118 that extends outward from the exposed upper or top side 115 of the fourth (e.g., final) level 114. FIG. 26 shows one example, in which a process 2600 is performed that forms the patterned conductive features 116 and 118 of the conductive elevated trace layer on select portions of the side 115 of the fourth level 114 to complete the multilevel packaging substrate 110. At 446, the die is attached to the multilevel packaging substrate 110. FIG. 27 shows one example, in which a flip-chip die attach process 2700 is performed that mounts the die 108 on the multilevel packaging substrate 110. The method also includes thermal processing for solder reflow or adhesive curing at 450. FIG. 28 shows one example, in which a thermal process 2800 is performed that reflows the solder 130 to complete the flip-chip mounting of the die 108 with the conductive terminals 109 soldered to electrically couple the conductive terminals to respective conductive landing areas of the fourth level 114 of the multilevel package substrate 110. The method 400 in another example includes wire bonding at 452. The method 400 includes package molding at 454. FIG. 29 shows one example, in which a molding process 2900 is performed that forms the molded package structure 120. The method 400 also includes package separation at 456. FIG. 30 shows one example, in which a saw cutting or laser cutting process 300 is performed that separates individual finished packaged electronic devices from a concurrently processed panel or array structure.

Modifications are possible in the described examples, and other implementations are possible, within the scope of the claims.

What is claimed is:

1. An electronic device, comprising:
   a multilevel package substrate having multiple levels including a first level and a final level, the first level extending in a first plane of a first direction and an orthogonal second direction and having conductive leads, and the final level having conductive landing areas along a side that extends in another plane of the first and second directions;
   a die mounted to the multilevel package substrate and having conductive terminals electrically coupled to respective ones of the conductive leads; and
   a package structure that encloses the die and a portion of the multilevel package substrate, the package structure exposing portions of the first level;
   the multilevel package substrate having a conductive elevated trace layer with a confinement feature that extends outward from the side of the final level along a third direction that is orthogonal to the first and second directions, the confinement feature having a sidewall configured to laterally confine one of a solder, an adhesive, a side of a passive component, and a side of the die.

2. The electronic device of claim 1, wherein:
   a given one of the conductive terminals of the die is soldered to a respective one of the conductive landing areas; and
   the sidewall of the confinement feature laterally confines the solder around the given one of the conductive terminals.

3. The electronic device of claim 2, wherein the sidewall of the confinement feature laterally surrounds the given one of the conductive terminals.

4. The electronic device of claim 1, wherein:
   the passive component is soldered to a respective one of the conductive landing areas; and
   the sidewall of the confinement feature laterally confines the solder between the passive component and the respective one of the conductive landing areas.

5. The electronic device of claim 4, wherein the confinement feature includes multiple portions laterally spaced apart from one another between a terminal of the passive component and the respective one of the conductive landing areas.

6. The electronic device of claim 4, wherein the confinement feature has a U-shape.

7. The electronic device of claim 1, wherein:
   the die is mounted to a respective one of the conductive landing areas using the adhesive; and
   the sidewall of the confinement feature laterally confines the adhesive between the die and the respective one of the conductive landing areas.

8. The electronic device of claim 7, wherein the sidewall of the confinement feature laterally surrounds the adhesive between the die and the respective one of the conductive landing areas.

9. The electronic device of claim 1, wherein:
   the die is mounted to a respective one of the conductive landing areas using the adhesive; and the sidewall of the confinement feature laterally confines the side of the die.

10. The electronic device of claim 9, wherein the sidewall of the confinement feature laterally surrounds the die.

11. A multilevel package substrate, comprising:
- a first level extending in a first plane of a first direction and an orthogonal second direction and having conductive leads;
- a final level having conductive landing areas along a side that extends in another plane of the first and second directions; and
- a conductive elevated trace layer with a confinement feature that extends outward from the side of the final level along a third direction that is orthogonal to the first and second directions, the confinement feature having a sidewall configured to laterally confine one of a solder, an adhesive, a side of a passive component, and a side of a die.

12. The multilevel package substrate of claim 11, wherein the sidewall of the confinement feature is configured to laterally surround and laterally confine the solder around a conductive terminal.

13. The multilevel package substrate of claim 11, wherein the confinement feature includes multiple portions, each portion having a sidewall configured to confine the solder between a passive component and a respective one of the conductive landing areas.

14. The multilevel package substrate of claim 11, wherein the confinement feature has a U-shape.

15. The multilevel package substrate of claim 11, wherein the sidewall of the confinement feature is configured to laterally surround and laterally confine the adhesive and the side of the die mounted to a respective one of the conductive landing areas.

16. A method of fabricating an electronic device, the method comprising:
- fabricating a multilevel package substrate, including a first level extending in a first plane of a first direction and an orthogonal second direction and having conductive leads, and a final level having conductive landing areas along a side that extends in another plane of the first and second directions;
- forming a conductive elevated trace layer with a confinement feature that extends outward from the side of the final level along a third direction that is orthogonal to the first and second directions, the confinement feature having a sidewall configured to laterally confine one of a solder, an adhesive, a side of a passive component, and a side of a die;
- attaching the die to the multilevel package substrate;
- electrically coupling conductive terminals of the die to respective ones of the conductive leads; and
- performing a molding process that forms a package structure that encloses the die and a portion of the multilevel package substrate, and the package structure exposes portions of the first level.

17. The method of claim 16, wherein:
- attaching the die to the multilevel package substrate includes mounting the die to the multilevel package substrate with a respective one of the conductive terminals laterally surrounded by the confinement feature; and
- electrically coupling the conductive terminals of the die to a respective one of the conductive landing areas that is laterally surrounded by the confinement feature.

18. The method of claim 17, further comprising:
- soldering the passive component to a second respective one of the conductive landing areas.

19. The method of claim 16, further comprising:
- soldering the passive component to a second respective one of the conductive landing areas.

20. The method of claim 16, wherein attaching the die to the multilevel package substrate includes:
- dispensing the adhesive on a respective one of the conductive landing areas that is laterally surrounded by the confinement feature; and
- mounting the die to the adhesive with the die laterally surrounded by the confinement feature.

* * * * *